US 8,610,989 B2

(12) United States Patent
Avouris et al.

(10) Patent No.: US 8,610,989 B2
(45) Date of Patent: Dec. 17, 2013

(54) OPTOELECTRONIC DEVICE EMPLOYING A MICROCAVITY INCLUDING A TWO-DIMENSIONAL CARBON LATTICE STRUCTURE

(75) Inventors: Phaedon Avouris, Yorktown Heights, NY (US); Mathias B. Steiner, Croton-on-Hudson, NY (US); Michael Engel, Karlsruhe (DE); Ralph Krupke, Stuttensee (DE); Andrea C. Ferrari, Cambridge (GB); Antonio Lombardo, Cambridge (GB)

(73) Assignees: International Business Machines Corporation, Armonk, NY (US); Karlsruher Institut Fuer Technologie (KIT) (DE); Cambridge Enterprise Limited (GB)

(*) Notice: Subject to any disclaimer, the term of this patent is extended or adjusted under 35 U.S.C. 154(b) by 218 days.

(21) Appl. No.: 13/285,279

(22) Filed: Oct. 31, 2011

(65) Prior Publication Data
US 2013/0107344 A1    May 2, 2013

(51) Int. Cl.
*G02F 1/03*        (2006.01)
*G02F 1/00*        (2006.01)
*H01L 27/14*       (2006.01)

(52) U.S. Cl.
USPC ........... 359/245; 359/237; 359/238; 257/428; 327/539

(58) Field of Classification Search
USPC ............... 359/237, 238, 241, 245, 291; 356/237.1; 362/84, 253; 372/44.01; 250/251, 281, 338.4; 327/539; 136/252, 263; 977/734, 742, 949, 951, 977/954; 438/26, 29, 63, 69; 257/13, 21, 257/40, 428, 436, 9, E29.168, E31.033, 257/E33.008, E51.018
See application file for complete search history.

(56) References Cited

U.S. PATENT DOCUMENTS 7,061,660 B1 *    6/2006    Chen et al. ............ 359/238
(Continued)

FOREIGN PATENT DOCUMENTS

JP         2-91623 A       3/1990
JP      2003-303978 A     10/2003

OTHER PUBLICATIONS

Xia, F. et al., "Graphene and Carbon Nanotube Photonics" 6th IEEE International Conference on Group IV Photonics GFP '09 (Sep. 9-11, 2009) pp. 217-219.
Xia, F. et al., "Graphene Nanophotonics" IEEE Photonics Journal-Breakthroughs in Photonics 2010 (Apr. 2011) pp. 293-295, vol. 3, No. 2.

(Continued)

*Primary Examiner* — Loha Ben
(74) *Attorney, Agent, or Firm* — Scully, Scott, Murphy & Presser, P.C.; Vazken Alexanian

(57) ABSTRACT

A microcavity-controlled two-dimensional carbon lattice structure device selectively modifies to reflect or to transmit, or emits, or absorbs, electromagnetic radiation depending on the wavelength of the electromagnetic radiation. The microcavity-controlled two-dimensional carbon lattice structure device employs a graphene layer or at least one carbon nanotube located within an optical center of a microcavity defined by a pair of partial mirrors that partially reflect electromagnetic radiation. The spacing between the mirror determines the efficiency of elastic and inelastic scattering of electromagnetic radiation inside the microcavity, and hence, determines a resonance wavelength of electronic radiation that is coupled to the microcavity. The resonance wavelength is tunable by selecting the dimensional and material parameters of the microcavity. The process for manufacturing this device is compatible with standard complementary metal oxide semiconductor (CMOS) manufacturing processes.

25 Claims, 21 Drawing Sheets

(56) References Cited

U.S. PATENT DOCUMENTS

| | | | |
|---|---|---|---|
| 7,254,151 B2 * | 8/2007 | Lieber et al. | 372/44.01 |
| 7,329,902 B2 | 2/2008 | Vinciguerra et al. | |
| 7,408,147 B2 * | 8/2008 | Blick et al. | 250/251 |
| 7,707,873 B2 * | 5/2010 | Degertekin | 73/105 |
| 7,745,816 B2 * | 6/2010 | Mohseni | 257/21 |
| 7,791,053 B2 * | 9/2010 | Buttrill | 250/493.1 |
| 7,903,338 B1 | 3/2011 | Wach | |
| 8,110,883 B2 * | 2/2012 | Ward et al. | 257/428 |
| 8,212,718 B2 * | 7/2012 | Utagawa et al. | 342/195 |
| 8,261,602 B2 * | 9/2012 | Degertekin | 73/105 |
| 8,328,375 B2 * | 12/2012 | Diekmann et al. | 362/84 |
| 2010/0200839 A1 | 8/2010 | Okai et al. | |
| 2011/0042650 A1 | 2/2011 | Avouris et al. | |
| 2011/0108805 A1 | 5/2011 | Okai | |
| 2011/0158268 A1 | 6/2011 | Song | |

OTHER PUBLICATIONS

Shan, G., "Photon Properties of Single Graphene Nanoribbon Microactivity Laser" eprint asXiv:1010.5559 (Oct. 28, 2010).

Bonaccorso, F. et al., "Graphene Photonics and Optoelectronics" Nature Photonics (Sep. 2010) pp. 611-622, vol. 4.

Xia, F. et al., "A Microactivity-Controlled, Current-Driven, on-chip Nanotube Emitter at Infrared Wavelengths" Nature Nanotechnology (Oct. 2008) pp. 608-613, vol. 3.

Xia, F. et al., "Ultrafast Graphene Photodetector" Nature Nanotechnology (Dec. 2009) pp. 839-843, vol. 4.

Furchi, M. et al., "Microactivity-Integrated Graphene Photodetector" Nano Letters (Jun. 13, 2012) pp. 2773-2777, vol. 12, No. 6.

International Search Report and Written Opinion dated Dec. 25, 2012, issued in International Application No. PCT/IB2012/056009.

* cited by examiner

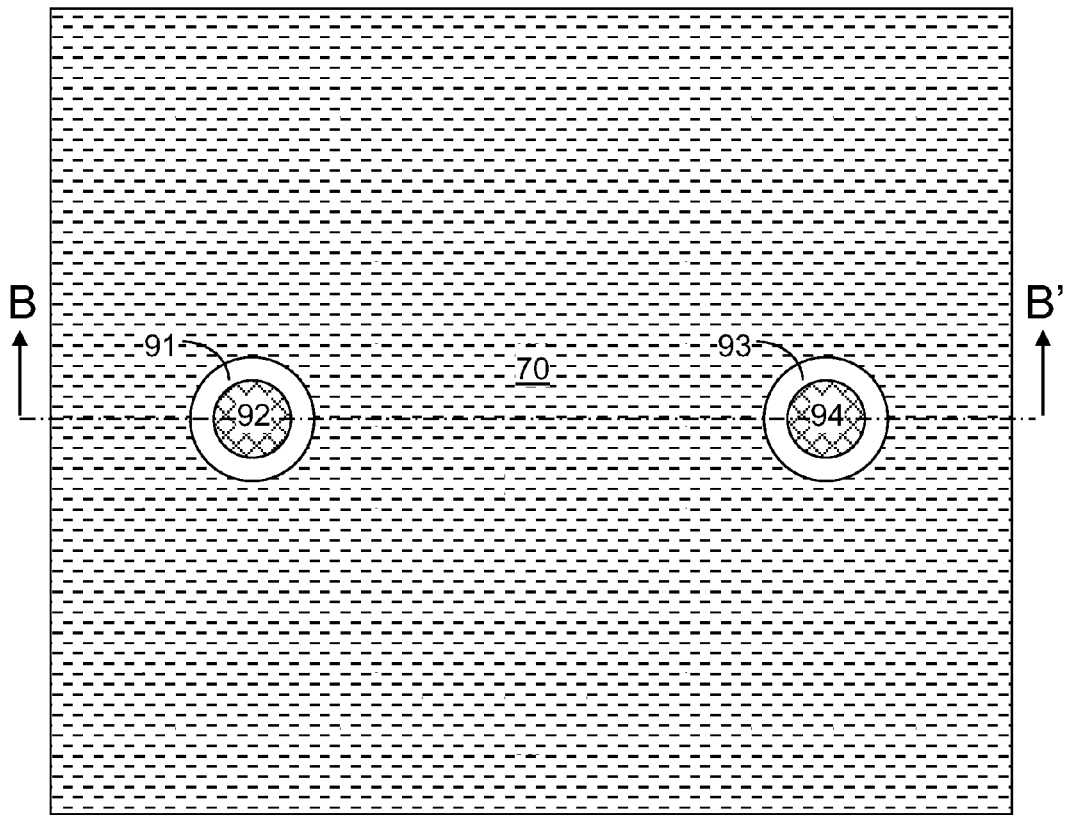
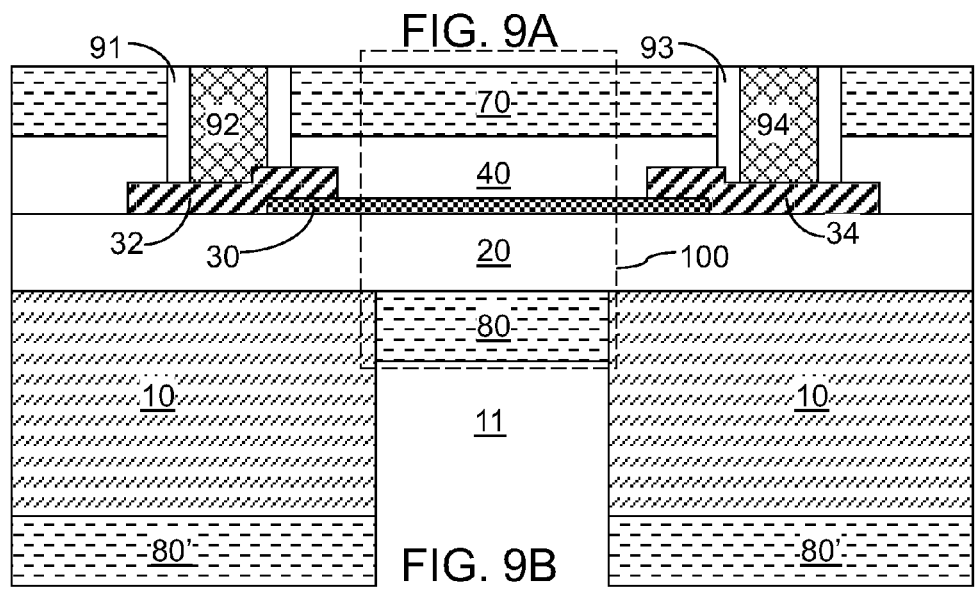

OPTOELECTRONIC DEVICE EMPLOYING A MICROCAVITY INCLUDING A TWO-DIMENSIONAL CARBON LATTICE STRUCTURE

BACKGROUND

The present disclosure relates to an optoelectronic device, and particularly to an optoelectronic device employing a microcavity and a two-dimensional lattice structure embedded therein, and methods of manufacturing the same.

Current optoelectronic technologies based on silicon and group III-V semiconductor compounds have large device footprints. For example, typical optoelectronic devices currently available have an average device area on the order of a square millimeter. Further, current optoelectronic devices also have a limited switching speed. For example, on-chip optoelectronic components operating in the terahertz regime are not currently available.

Two-dimensional carbon lattice structures include $sp^2$- bonded carbon atoms that are densely packed in a hexagonal lattice structure. If the two-dimensional carbon lattice structure is topologically planar, the two-dimensional carbon lattice structure constitutes a graphene layer. If the two-dimensional carbon lattice structure includes a curvature in one direction and the two-dimensional carbon lattice structure wraps around to form a topologically tube-shaped structure, the two-dimensional carbon lattice structure constitutes a carbon nanotube.

A graphene layer and a carbon nanotube allow for modulating charge carrier densities at a very high speed. Moreover, a graphene layer and a carbon nanotube absorb and emit light across the entire range of the electromagnetic spectrum, and sustain high electrical current densities and extreme temperatures. Despite the superior performance potential of a graphene layer and a carbon nanotube relative to silicon and group III-V semiconductor compounds in terms of such properties, formation of a compact optoelectronic device based on a graphene layer or a carbon nanotube and smaller than currently available optoelectronic technologies based on silicon and group III-V semiconductor compounds is a significant challenge because coupling between electromagnetic radiation and charge carriers of the graphene layer and/or the carbon nanotube is relatively weak.

BRIEF SUMMARY

A microcavity-controlled two-dimensional carbon lattice structure device selectively modifies to reflect or to transmit, or emits, or absorbs, electromagnetic radiation depending on the wavelength of the electromagnetic radiation. The microcavity-controlled two-dimensional carbon lattice structure device employs a graphene layer or at least one carbon nanotube located within an optical center of a microcavity defined by a pair of partial mirrors that partially reflect electromagnetic radiation. The spacing between the mirrors determines the efficiency of elastic and inelastic scattering of electromagnetic radiation inside the microcavity, and hence, determines a resonance wavelength of electronic radiation that is coupled to the microcavity. The resonance wavelength is tunable by selecting the dimensional and material parameters of the microcavity. The process for manufacturing this device is compatible with standard complementary metal oxide semiconductor (CMOS) manufacturing processes.

According to an aspect of the present disclosure, an electromagnetic radiation detector is provided, which includes: a stack, from bottom to top, of a first partial mirror, a first transparent layer, a second transparent layer, and a second partial mirror; at least one two-dimensional carbon lattice structure embedded in the second transparent layer; a first contact electrode in contact with one end of the at least one two-dimensional carbon lattice structure and embedded within the second transparent layer; a second contact electrode in contact with an opposite end of the at least one two-dimensional carbon lattice structure and embedded within the second transparent layer; and a circuit connected across the first contact electrode and the second contact electrode and configured to provide an electrical bias voltage across the first contact electrode and the second contact electrode and to measure electrical current that passes through the at least one two-dimensional carbon lattice structure upon irradiation of the at least one two-dimensional carbon lattice structure with electromagnetic radiation.

According to another aspect of the present disclosure, an electromagnetic radiation emitter is provided, which includes: a stack, from bottom to top, of a first partial mirror, a first transparent layer, a second transparent layer, and a second partial mirror; at least one two-dimensional carbon lattice structure embedded in the second transparent layer; a first contact electrode in contact with one end of the at least one two-dimensional carbon lattice structure and embedded within the second transparent layer; a second contact electrode in contact with an opposite end of the at least one two-dimensional carbon lattice structure and embedded within the second transparent layer; and a circuit connected across the first contact electrode and the second contact electrode and configured to provide an electrical bias voltage across the first contact electrode and the second contact electrode and to switch electrical current that passes through the at least one two-dimensional carbon lattice structure, wherein electromagnetic radiation is emitted from the at least one two-dimensional carbon lattice structure while electrical current passes through the at least one two-dimensional carbon lattice structure.

According to yet another aspect of the present disclosure, an electromagnetic radiation modulator is provided, which includes: a stack, from bottom to top, of a first partial mirror, a first transparent layer, a second transparent layer, and a second partial mirror; at least one two-dimensional carbon lattice structure embedded in the second transparent layer; a first contact electrode in contact with one end of the at least one two-dimensional carbon lattice structure and embedded within the second transparent layer; a second contact electrode in contact with an opposite end of the at least one two-dimensional carbon lattice structure and embedded within the second transparent layer; and a circuit configured to apply electrical bias to one of the first partial mirror and the second partial mirror relative to the first contact electrode, and to modulate electrical current through the at least one two-dimensional carbon lattice structure, wherein a transmission coefficient of electromagnetic radiation passing through the stack is modulated by electrical current passing through the at least one two-dimensional carbon lattice structure.

According to still another aspect of the present disclosure, a method of forming an optoelectronic device is provided, which includes: forming a first transparent layer on a substrate; placing at least one two-dimensional carbon lattice structure on a top surface of the first transparent layer; forming a first contact electrode on one end of the at least one two-dimensional carbon lattice structure and a second contact electrode on another end of the at least one two-dimensional carbon lattice structure; forming a second transparent layer on the at least one two-dimensional carbon lattice structure, the first and second contact electrodes, and the first transparent layer; forming a first partial mirror on a bottom surface of the first transparent layer and a second partial mirror on a top surface of the second transparent layer; and forming a circuit that electrically biases the second contact electrode relative the first contact electrode.

BRIEF DESCRIPTION OF THE SEVERAL VIEWS OF THE DRAWINGS

FIG. 9A is a top-down view of the first exemplary structure after formation contact via structures that provide electrical contact to the contact electrodes according to the first embodiment of the present disclosure.

FIG. 9B is a vertical cross-sectional view of the first exemplary structure of FIG. 9A along the plane B-B' in FIG. 9A.

DETAILED DESCRIPTION

Figure 1A:
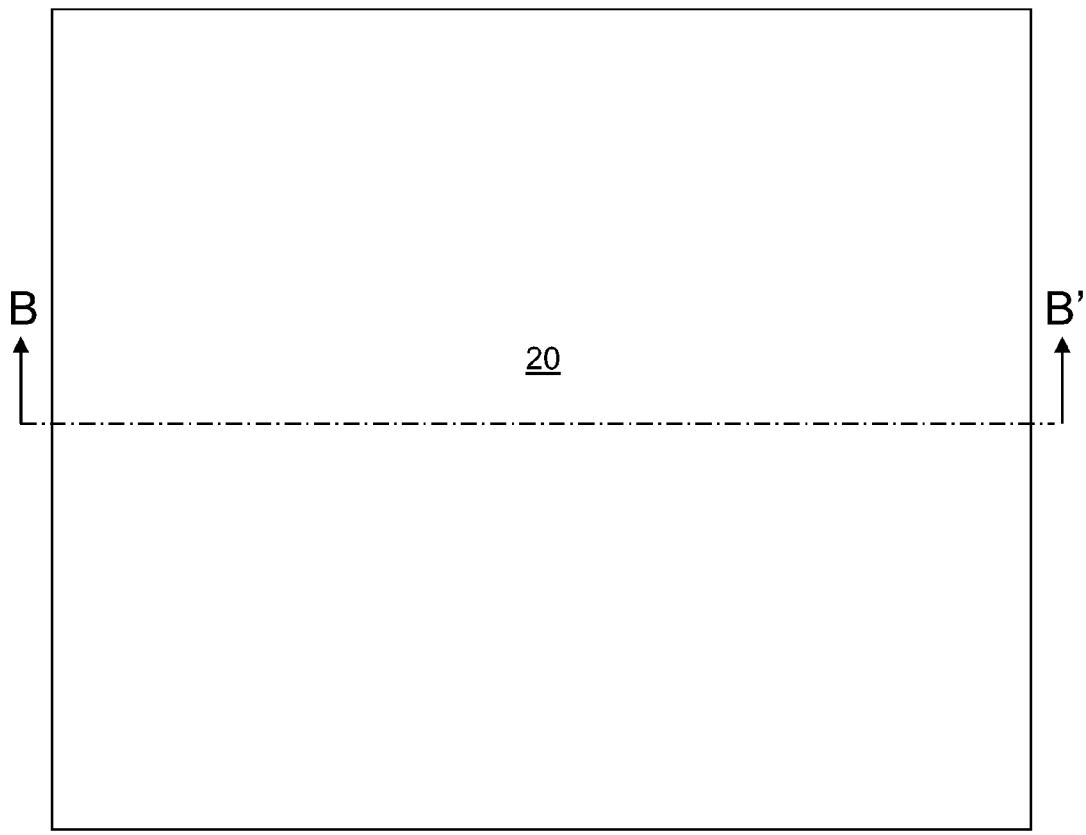
FIG. 1A is a top-down view of a first exemplary structure after formation of a first transparent layer on a substrate according to a first embodiment of the present disclosure.

As stated above, the present disclosure relates to an optoelectronic device employing a microcavity and a two-dimensional lattice structure embedded therein, and methods of manufacturing the same, which are now described in detail with accompanying figures. It is noted that like reference numerals refer to like elements across different embodiments.

Figure 1B:
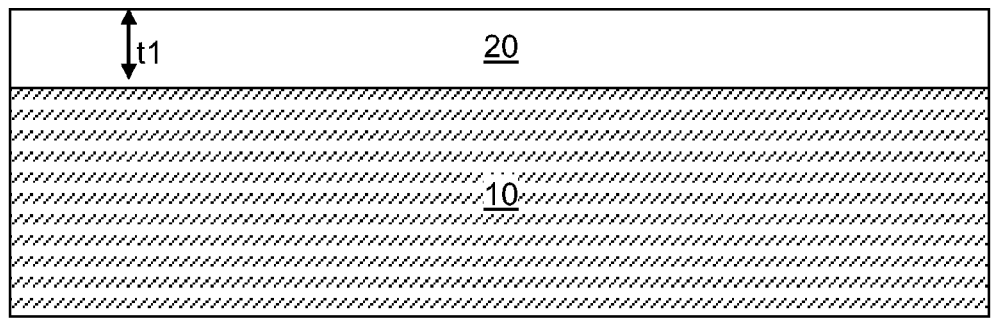
FIG. 1B is a vertical cross-sectional view of the first exemplary structure of FIG. 1A along the plane B-B' in FIG. 1A.

Referring to FIGS. 1A and 1B, a first exemplary structure according to a first embodiment of the present disclosure includes a substrate 10. The substrate 10 can include a conductive material, an insulator material, a semiconductor material, or any solid material provided that the substrate 10 can provide structural support to layers to be subsequently formed.

A first transparent layer 20 having a first thickness t1 is formed on the top surface of the substrate 10. The first transparent layer 20 includes a material that is optically transparent within a wavelength range, which is herein referred to as a first transparent wavelength range. The first transparent layer 20 can be formed, for example, by chemical vapor deposition, physical vapor deposition, vacuum evaporation or evaporation at subatomic pressure, atomic layer deposition, spin coating, layer transfer and bonding from another substrate, or a combination thereof. The first transparent layer 20 has a first refractive index of n1.

A first wavelength $\lambda 1$ is herein defined as the product of 4 and the first thickness t1 and the first refractive index n1, i.e., $\lambda 1 = 4 \times t1 \times n1$. If the first refractive index n1 is a function of wavelength of electromagnetic radiation, the first refractive index n1 herein refers to value at the first wavelength $\lambda 1$. It is noted that a refractive index of a material is a slowly varying function of the wavelength of electromagnetic radiation, and thus, the first wavelength $\lambda 1$ can be defined for any given value of the first thickness t1.

The material of the first transparent layer 20 is optically transparent at the first wavelength $\lambda 1$, i.e., has a transmission coefficient that is substantially equal to 1 at the first wavelength $\lambda 1$. The first refractive index n1 can have a value from 1.0 to 10, although greater values for the first refractive index n1 can also be employed. The first thickness t1 can be from 2.5 nm to 1 cm, although lesser and greater values can be employed for the first thickness t1. In one embodiment, the first wavelength $\lambda 1$ can be in the ultraviolet range, i.e., from 10 nm to 400 nm, in the visible range, i.e., from 400 nm to 800 nm, or in the infrared range, i.e., from 800 nm to 1 mm.

The material of the first transparent layer 20 can be, for example, silicon oxide, silicon nitride, silicon oxynitride, a dielectric oxide of an alkali metal, a dielectric oxide of an alkaline earth metal, a dielectric oxide of a transition metal, a dielectric oxide of a Lanthanide, a dielectric oxide of an Actinide, a dielectric nitride of a metallic element, or an alloy thereof.

Figure 2A:
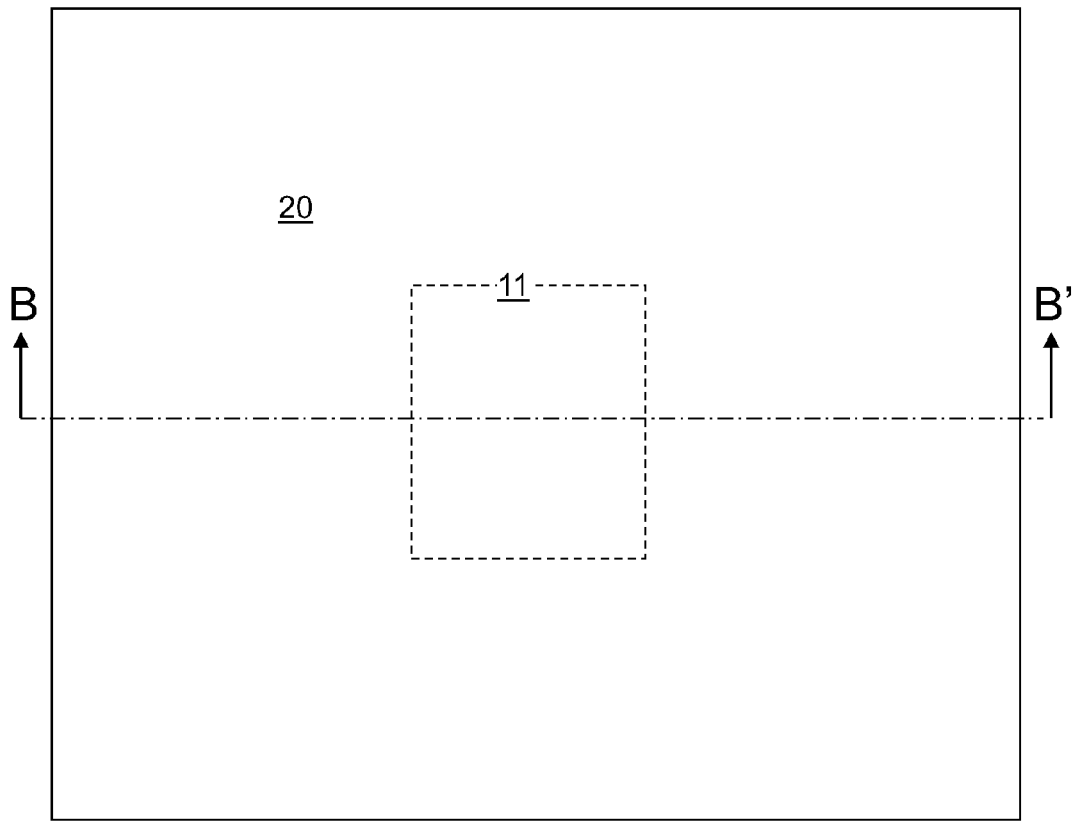
FIG. 2A is a top-down view of the first exemplary structure after formation of a trench within the substrate and exposure of a bottom surface of the first transparent layer according to the first embodiment of the present disclosure.
Figure 2B:
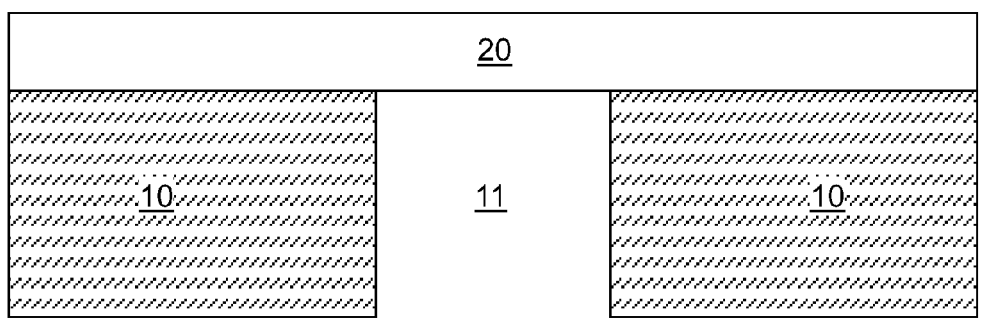
FIG. 2B is a vertical cross-sectional view of the first exemplary structure of FIG. 2A along the plane B-B' in FIG. 2A.

Referring to FIGS. 2A and 2B, a trench 11 is formed through a portion of the substrate 10 so that a bottom surface of the first transparent layer 20 is physically exposed within the trench 11. The area of the trench 11 is schematically illustrated with a dotted rectangle in FIG. 2A.

The trench 11 can be formed, for example, by flipping the first exemplary structure upside down, applying a photoresist (not shown) on the substrate 10, patterning the photoresist by lithographic exposure and development, transferring the pattern in the photoresist through the substrate 10 by an etch process that employs the patterned photoresist as an etch mask, and removing the photoresist selective to the first transparent layer 20. The etch process can include an anisotropic etch such as a reactive ion etch, and/or an isotropic etch such as a wet etch. For example, if the first transparent layer 20 includes silicon oxide or silicon nitride and the substrate 10 includes a semiconductor material, an anisotropic etch or a wet etch that removes the semiconductor material selective to silicon oxide or silicon nitride can be employed.

The etch process continues until a physically exposed surface of the first transparent layer 20 is detected at a bottom surface of the trench 11 (while the first exemplary structure is upside down). The end portion of the etch process employs an etch chemistry that etches the material of the substrate 10 selective to the material of the first transparent layer 20, i.e., etches the material of the substrate 10 while not etching the material of the first transparent layer 20. The removal of the photoresist can be effected, for example, by ashing.

The lateral dimensions of the trench 11 (e.g., the length of a side for a trench 11 having a rectangular cross-sectional area or a diameter for a trench 11 having a circular horizontal cross-sectional area) is greater than the first wavelength $\lambda 1$, and can be from 50 nm to 1 cm, although lesser and greater lateral dimensions can also be employed.

Figure 3A:
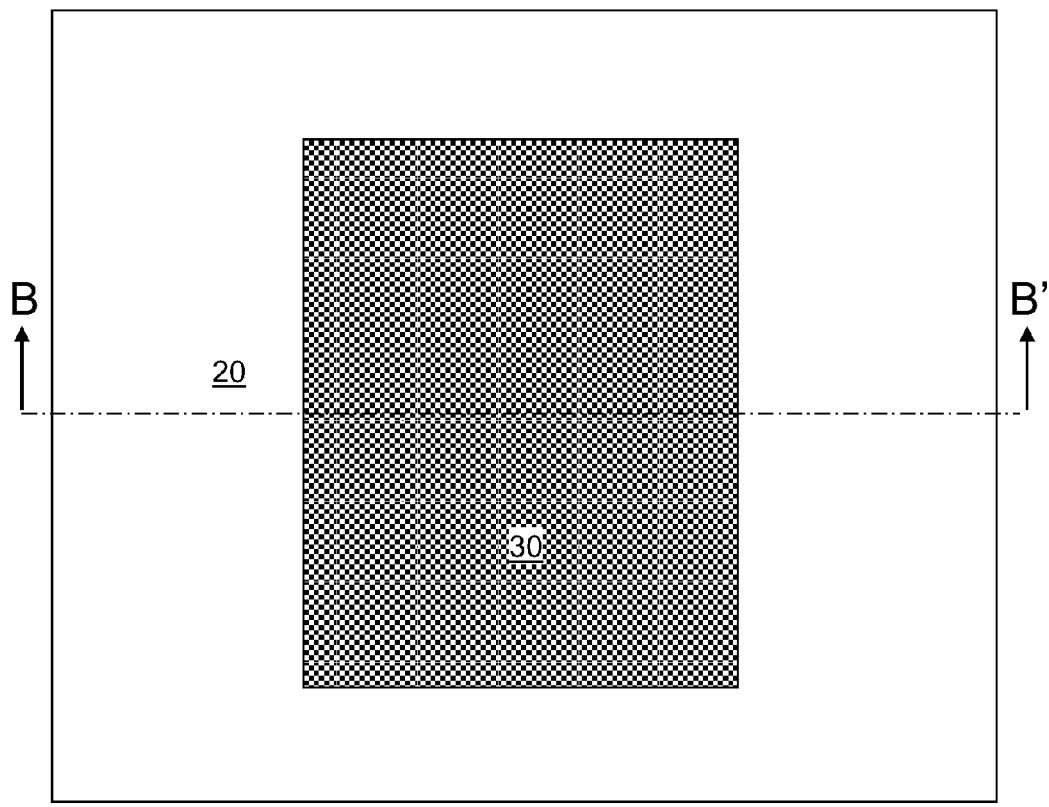
FIG. 3A is a top-down view of the first exemplary structure after attachment of at least one graphene layer on a top surface of the first transparent layer according to the first embodiment of the present disclosure.
Figure 3B:
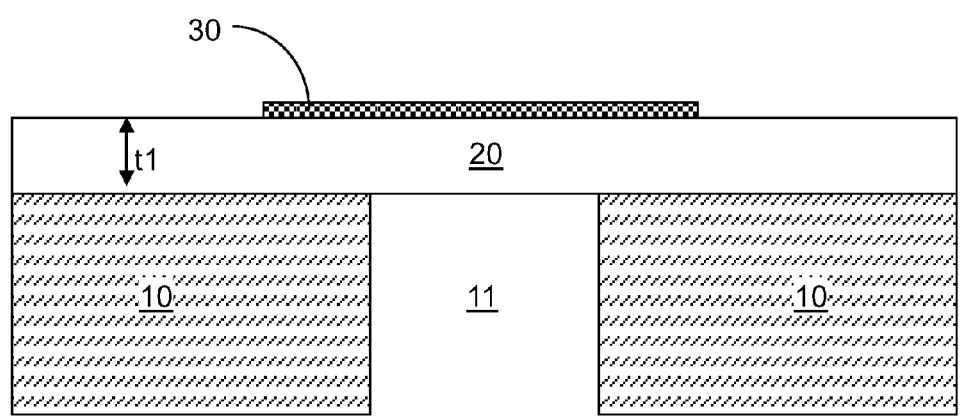
FIG. 3B is a vertical cross-sectional view of the first exemplary structure of FIG. 3A along the plane B-B' in FIG. 3A.

Referring to FIGS. 3A and 3B, at least one two-dimensional carbon lattice structure 30 is placed on the top surface of the first transparent layer 20. As used herein, a two-dimensional carbon lattice structure refers to any carbon lattice structure in which $sp^2$-bonded carbon atoms are densely packed in a hexagonal lattice structure. Two-dimensional carbon lattice structures include, for example, a graphene monolayer, a carbon nanotube or a film or array thereof.

In the first embodiment, the at least one two-dimensional carbon lattice structure can be at least one graphene layer 30, which is attached to the top surface of the first transparent layer 20 by a layer transfer process. The at least one graphene layer 30 can be a monolayer of graphene, or can be a stack of a plurality of graphene monolayers. If the at least one graphene layer 30 includes a stack of a plurality of graphene monolayers, the total number of the graphene monolayers within the at least one graphene layer 30 can be, for example, from 2 to 10, although a greater number can also be employed. The at least one graphene layer 30 can be mechanically exfoliated from any structure including one or more graphene layers, and can be transferred onto the top surface of the first transparent layer 20.

In one embodiment, the thickness of the at least one graphene layer 30 can be selected to be less than 25% of the first thickness t1. In one embodiment, the thickness the thickness of the at least one graphene layer 30 can be selected to be less than 10% of the first thickness t1. The smaller the ratio of the thickness of the at least one graphene layer 30, the greater the fraction of the volume of the at least one graphene layer 30 that is placed near the peak of the amplitude of electromagnetic radiation that forms a standing wave within a microcavity that includes the first transparent layer 20 and a second transparent layer to be subsequently formed. Because the at least one graphene layer 30 is placed on a planar top surface of the first transparent layer, the bottom surface of the at least one graphene layer 30 is coplanar with the top surface of the first transparent layer 20.

Figure 4A:
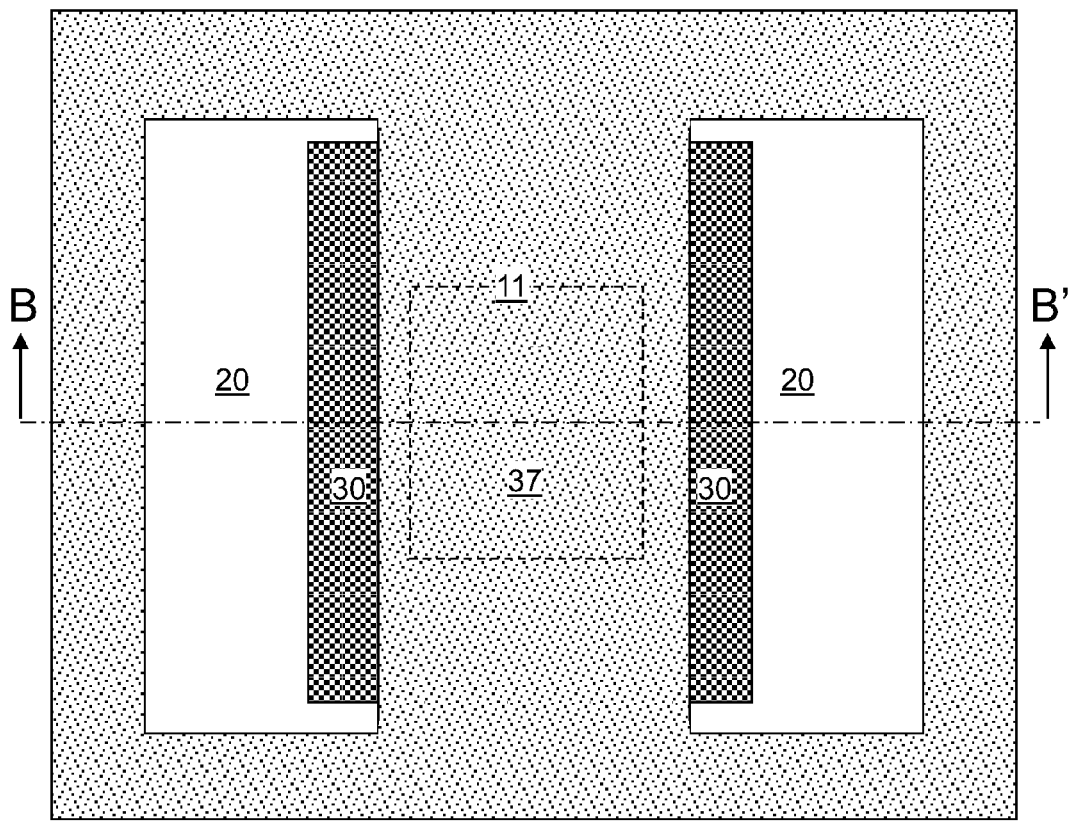
FIG. 4A is a top-down view of the first exemplary structure after application and patterning of a mask layer over the at least one graphene layer and the first transparent layer according to the first embodiment of the present disclosure.
Figure 4B:
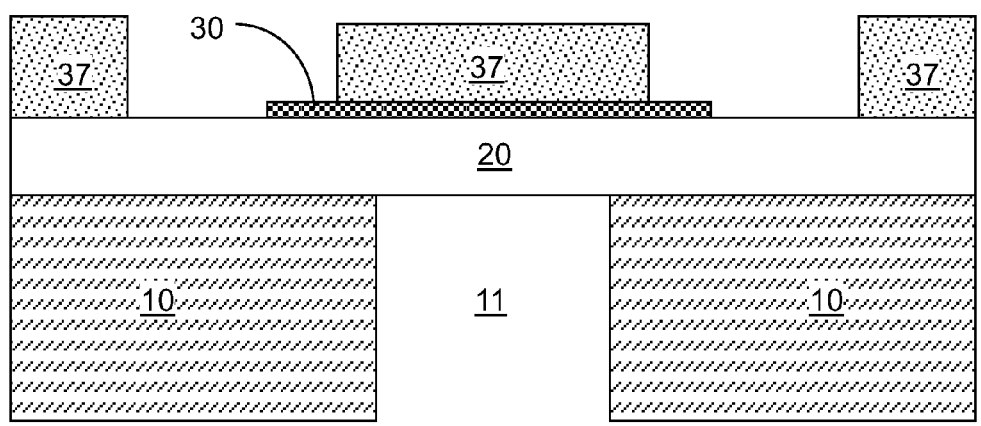
FIG. 4B is a vertical cross-sectional view of the first exemplary structure of FIG. 4A along the plane B-B' in FIG. 4A.

Referring to FIGS. 4A and 4B, a mask layer 37 is deposited over the physically exposed top surface of the at least one graphene layer 30 and the first transparent layer 20, and is lithographically patterned. In one embodiment, the mask layer 37 is a soft mask layer including a carbon-based material. For example, the mask layer 37 can include a photoresist, a material sensitive to electron beam irradiation, i.e., an e-beam resist (e.g., poly(methyl methacrylate) or hydrogen silsesquioxane), or a carbon-based material that is not sensitive to irradiation by photons or electrons. Alternately, the mark layer 37 can be a hard mask layer including a material that is not carbon-based. For example, the mask layer 37 can include a dielectric material different from the dielectric material of the insulator layer, or can include a metallic material. The material of the mask layer 37 is selected such that an etch process exists that can etch the material of the mask layer 37 selective to the material of the at least one graphene layer 30 and the material of the first transparent layer 20. For example, if the mask layer 37 includes an organic material such as a photoresist or an e-bean resist, the etch process to be subsequently used can employ an organic solvent such as acetone.

If the mask layer 37 includes a photoresist, the mask layer 37 can be patterned by lithographic exposure and subsequent development. If the mask layer 37 includes an e-beam resist, the mask layer 37 can be patterned by exposure with electron beam and subsequent development. If the mask layer 37 is a hard mask layer or if the mask layer 37 includes a carbon-based material that is not sensitive to irradiation by photons or electrons, the mask layer 37 can be patterned by applying a photoresist layer (not shown) or an e-beam resist layer (not shown) thereupon, patterning the photoresist layer or the e-beam resist layer, transferring the pattern into the mask layer 37, and optionally removing the photoresist layer or the e-beam resist layer.

A first opening and a second opening laterally separated from the first opening are formed within the mask layer 37. The mask layer 37 covers at least a center portion of the region of the at least one graphene layer overlying the trench 11. In one embodiment, the mask layer 37 can cover the entirety of the region of the at least one graphene layer overlying the trench 11 as illustrated in FIGS. 4A and 4B. In another embodiment, the mask layer 37 can cover a center portion of the region of the at least one graphene layer overlying the trench 11, and at least one peripheral portion of the region of the at least one graphene layer overlying the trench 11 can be within the area of the openings in the mask layer 37 trench.

Lateral dimensions of each of the first opening and the second opening (e.g., the length of a side for an opening having a rectangular cross-sectional area or a diameter for an opening having a circular horizontal cross-sectional area) can be 20 nm to 1 cm, although lesser and greater lateral dimensions can also be employed. The effective area of the optoelectronic device to be subsequently formed is determined by the common area between the area of the trench 11 and the area of the mask layer 37 as patterned.

Figure 5A:
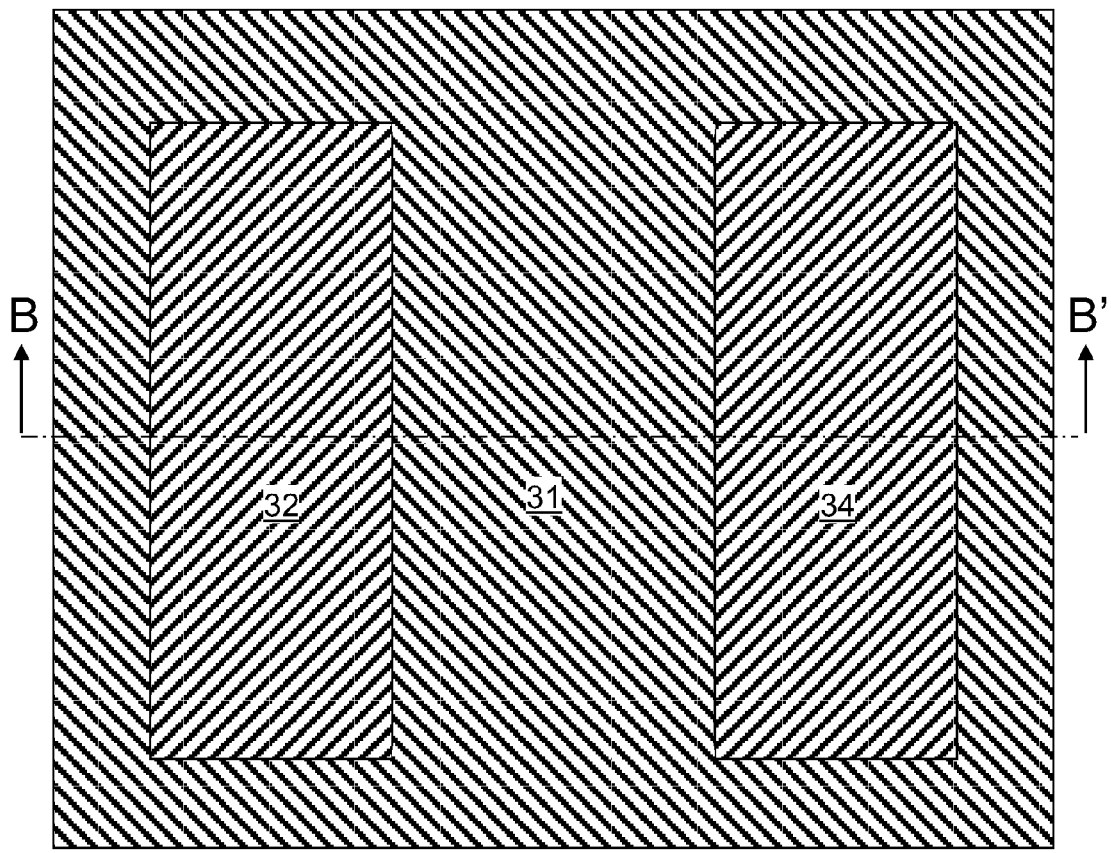
FIG. 5A is a top-down view of the first exemplary structure after formation of contact electrodes by a masked deposition according to the first embodiment of the present disclosure.
Figure 5B:
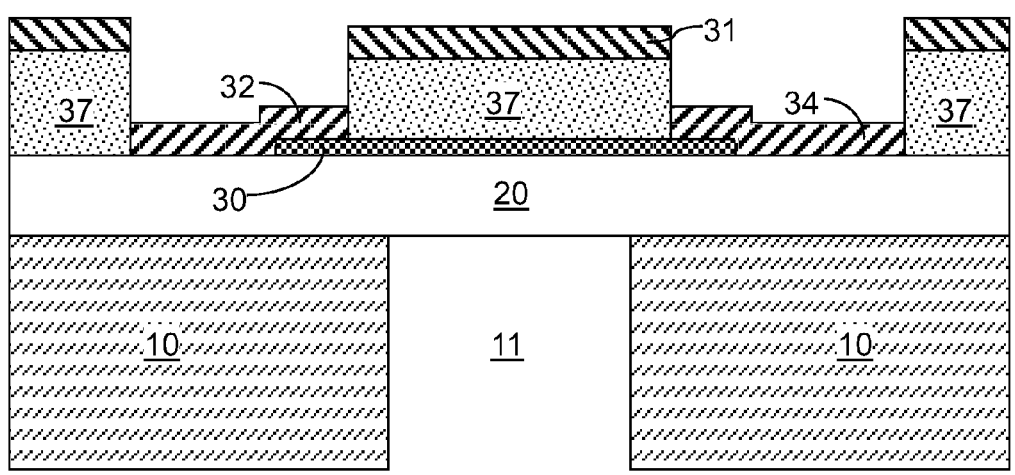
FIG. 5B is a vertical cross-sectional view of the first exemplary structure of FIG. 5A along the plane B-B' in FIG. 5A.

Referring to FIGS. 5A and 5B, a conductive material is anisotropically deposited in the openings and over the mask layer 37 in a direction perpendicular to the top surface of the first transparent layer 20. A portion of the conductive material deposited in the first opening forms a first contact electrode 32. A portion of the conductive material deposited in the second opening forms a second contact electrode 34. The conductive material deposited over the mask layer 37 is herein referred to an overlying conductive material layer 31. The first contact electrode 32, the second contact electrode 34, and the overlying conductive material layer 31 are formed simultaneously.

The first contact electrode 32, the second contact electrode 34, and the overlying conductive material layer 31 includes an elemental metal, an alloy of at least two elemental metals, a conductive metallic nitride, a conductive metallic carbide, a doped semiconductor material, an alloy thereof, and/or a stack thereof. The materials that can be employed for the first contact electrode 32, the second contact electrode 34, and the overlying conductive material layer 31 include, but are not limited to, Pd, Pt, Ni, Au, Ag, Cu, Al, Ti, Ta, W, TiN, TaN, WN, TiC, TaC, WC, doped silicon, an alloy thereof, and a stack thereof.

The conductive material of the first contact electrode 32, the second contact electrode 34, and the overlying conductive material layer 31 can be deposited, for example, by vacuum evaporation, physical vapor deposition, or a combination thereof.

The first contact electrode 32, the second contact electrode 34, and the overlying conductive material layer 31 have a same composition and a same thickness. The thickness of the first contact electrode 32 and the second contact electrode 34 can be from 5 nm to 1,000 nm, although lesser and greater thicknesses can also be employed. The thickness of the first contact electrode 32 and the second contact electrode 34 is less than the thickness of the mask layer 37. Each of the first contact electrode 32 and the second contact electrode 34 has a bottommost surface that is coplanar with the top surface of the first transparent layer 20.

Figure 6A:
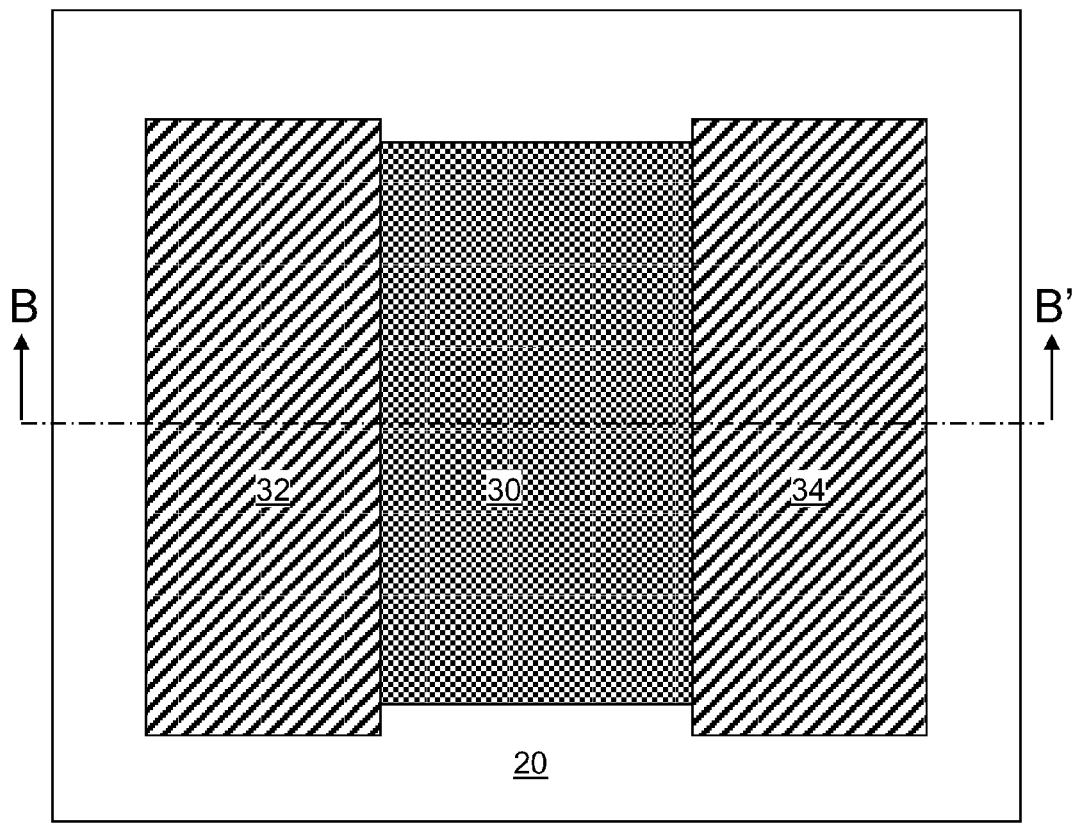
FIG. 6A is a top-down view of the first exemplary structure after a lift-off of the mask layer according to the first embodiment of the present disclosure.
Figure 6B:
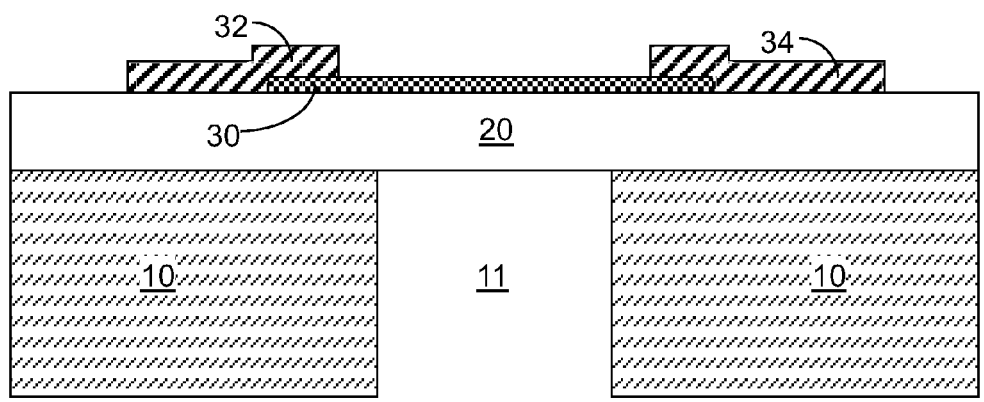
FIG. 6B is a vertical cross-sectional view of the first exemplary structure of FIG. 6A along the plane B-B' in FIG. 6A.

Referring to FIGS. 6A and 6B, the mask layer 37 and the overlying conductive material layer 31 are lifted off the first transparent layer 20, the at least one graphene layer 30, the first contact electrode 32, and the second contact electrode 34, for example, by an etch. The etch can be a wet etch that dissolves the material of the mask layer 37 selective to the dielectric material of the first transparent layer 20 and selective to the conductive material of the first contact electrode 32 and the second contact electrode 34. For example, if the mask layer 37 is a soft mask layer, an organic solvent that dissolves the carbon-based material of the soft mask layer selective to the dielectric material of the first transparent layer 20 and the conductive material of the first contact electrode 32 and the second contact electrode 34 can be employed. If the mask layer 37 is a hard mask layer, a wet etch chemistry that dissolves the material of the hard mask layer selective the dielectric material of the first transparent layer 20 and the conductive material of the first contact electrode 32 and the second contact electrode 34 can be employed. The overlying conductive material layer 31 is not dissolved during the lift-off process, but is physically separated from the first transparent layer 20, the at least one graphene layer 30, the first contact electrode 32, and the second contact electrode 34 as the material of the mask layer 37 is etched or dissolved. The bottommost surfaces of the first contact electrode 32 and the second contact electrode 34 are coplanar with the top surface of the first transparent layer 20.

Figure 7A:
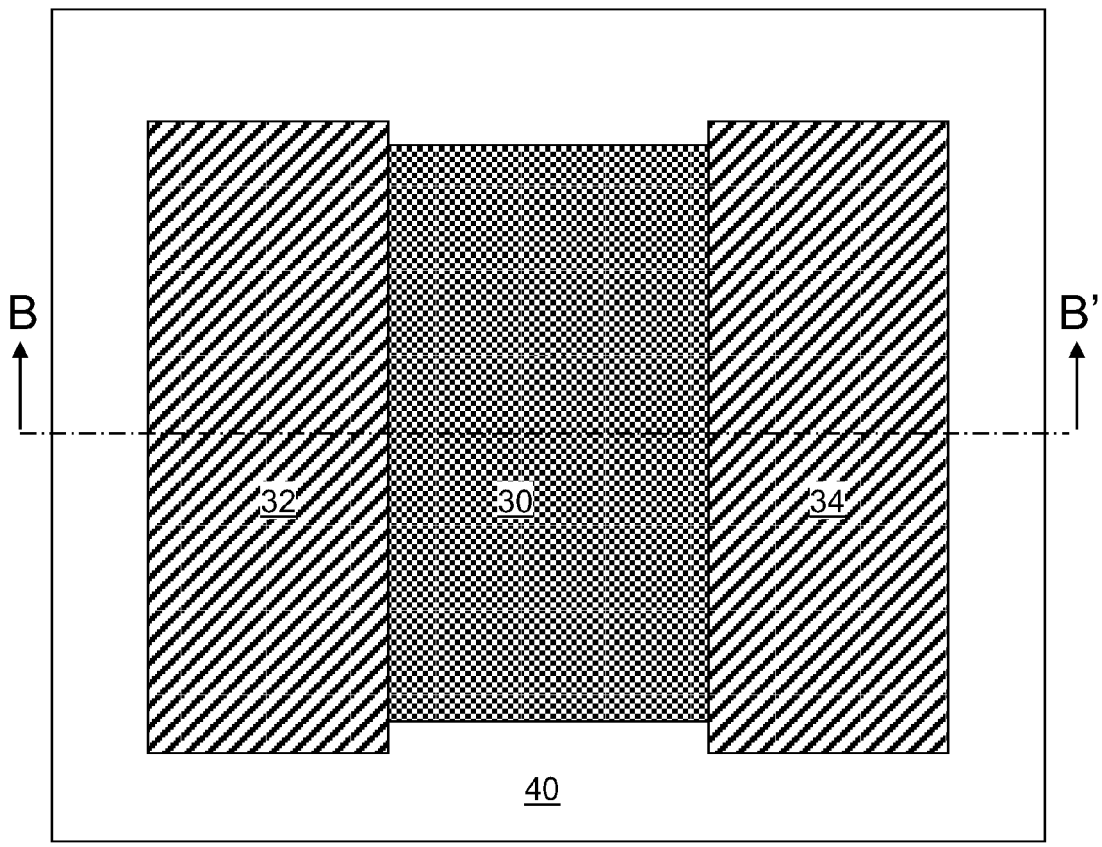
FIG. 7A is a top-down view of the first exemplary structure after formation of a second transparent layer according to the first embodiment of the present disclosure.
Figure 7B:
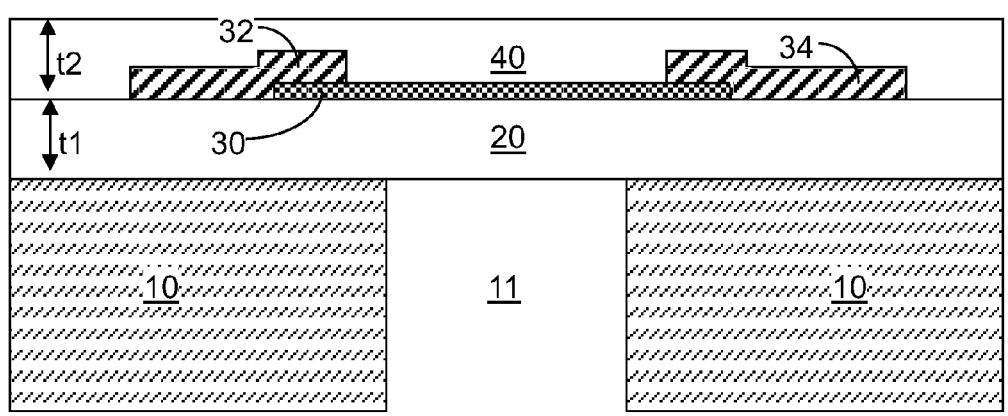
FIG. 7B is a vertical cross-sectional view of the first exemplary structure of FIG. 7A along the plane B-B' in FIG. 7A.

Referring to FIGS. 7A and 7B, a second transparent layer 40 having a second thickness t2 is formed on the physically exposed top surfaces of the first transparent layer 20, the at least one graphene layer 30, the first contact electrode 32, and the second contact electrode 34. The second transparent layer 40 includes a material that is optically transparent within a wavelength range, which is herein referred to as a second transparent wavelength range. The second transparent layer 40 can be formed, for example, by chemical vapor deposition, physical vapor deposition, vacuum evaporation or evaporation at subatomic pressure, atomic layer deposition, spin coating, or a combination thereof. The material of the second transparent layer 40 can be any of the material that can be employed for the material of the first transparent layer 20. The second transparent layer 40 has a second refractive index of n2.

A second wavelength $\lambda 2$ is herein defined as the product of 4 and the second thickness t2 and the second refractive index n2, i.e., $\lambda 2 = 4 \times t2 \times n2$. If the second refractive n2 is a function of wavelength of electromagnetic radiation, the second refractive index n2 herein refers to value at the second wavelength $\lambda 2$. The second wavelength $\lambda 2$ can be defined for any given value of the second thickness t2.

The material of the second transparent layer 40 is optically transparent at the second wavelength λ2. The second refractive index n2 can have a value from 1.0 to 10, although greater values for the second refractive index n2 can also be employed. The second thickness t2 can be from 2.5 nm to 2 cm, although lesser and greater values can be employed for the second thickness t2. In one embodiment, the second wavelength λ2 can be in the ultraviolet range, i.e., from 10 nm to 400 nm, in the visible range, i.e., from 400 nm to 800 nm, or in the infrared range, i.e., from 800 nm to 2 mm.

It is understood that the at least one graphene layer 30, the first contact electrode 32, and the second contact electrode 34 may, or may not, be visible through the second transparent layer 40 in the top-down view of FIG. 7A depending on whether the material of the second transparent layer 40 is optically transparent within the visible spectrum. For example, if the second wavelength λ2 is within the infrared range or within the ultraviolet range and if the material of the second transparent layer 40 is not optically transparent in the visible spectrum (between 400 nm and 800 nm in wavelength), the at least one graphene layer 30, the first contact electrode 32, and the second contact electrode 34 may not be visible in the top-down view of FIG. 7A.

Further, while FIG. 7B illustrates an embodiment in which the topography of the top surface of the second transparent layer 40 is planar (which occurs, for example, when the thicknesses of the at least one graphene layer 30 and the first and second contact electrodes (32, 34) are negligible compared to the second thickness t2), embodiments are also contemplated in which the thicknesses of the at least one graphene layer 30 and the first and second contact electrodes (32, 34) are not negligible compared to the second thickness t2, and the top surface of the second transparent layer 40 has a topography that reflects the underlying topography of the top surfaces of the at least one graphene layer 30 and the first and second contact electrodes (32, 34).

The second wavelength λ2 can be substantially the same as the first wavelength λ1, i.e., $4 \times t1 \times n1 \cong 4 \times t2 \times n2$. In one embodiment, the second wavelength λ2 can be within 25% of the first wavelength λ1, i.e., $0.75 \times \lambda 1 < \lambda 2 < 1.25 \times \lambda 1$. In other words, the product of the first thickness t1 and the first index of refraction n1 can be within 25% of the product of the second thickness t2 and the second index of refraction n2. In one embodiment, the second wavelength λ2 can be within 10% of the first wavelength λ1, i.e., $0.90 \times \lambda 1 < \lambda 2 < 1.10 \times \lambda 1$. In one embodiment, the second wavelength λ2 can be within 1% of the first wavelength λ1, i.e., $0.99 \times \lambda 1 < \lambda 2 < 1.01 \times \lambda 1$. In one embodiment, the second wavelength λ2 can the same as the first wavelength λ1 within the limit of measurement errors.

In one embodiment, the material of the first transparent layer 20 can be the same as the material of the second transparent layer 40. In this case, the first index of refraction n1 is the same as the second index of refraction n2. In this case, the second thickness t2 can be substantially the same as the first thickness t1. In one embodiment, the second thickness t2 can be within 25% of the first thickness t1, i.e., $0.75 \times t1 < t2 < 1.25 \times t1$. In other words, the first thickness t1 can be within 25% of the second thickness t2. In one embodiment, the second thickness t2 can be within 10% of the first thickness t1, i.e., $0.90 \times t1 < t2 < 1.10 \times t1$. In one embodiment, the second thickness t2 can be within 1% of the first thickness t1, i.e., $0.99 \times t1 < t2 < 1.01 \times t1$. In one embodiment, the second thickness t2 can be the same as the first thickness t1 within the limit of measurement errors.

Figure 8A:
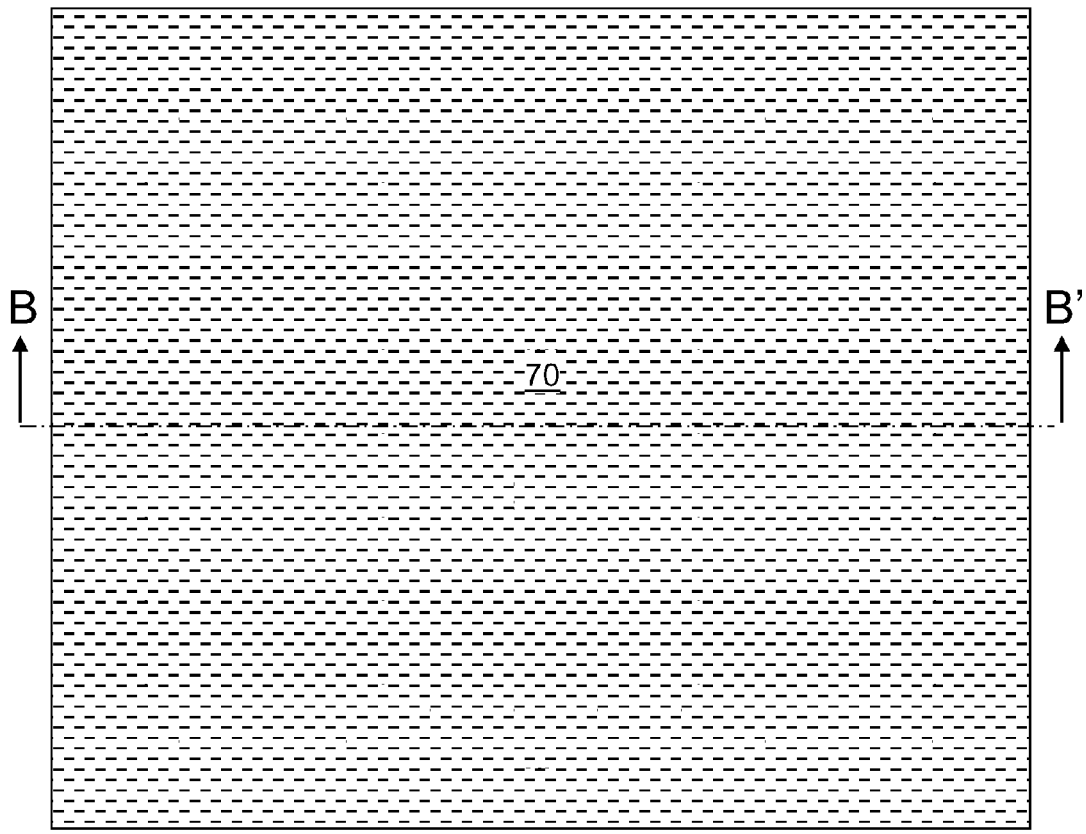
FIG. 8A is a top-down view of the first exemplary structure after formation of a front-side partial mirror and a back-side partial mirror according to the first embodiment of the present disclosure.
Figure 8B:
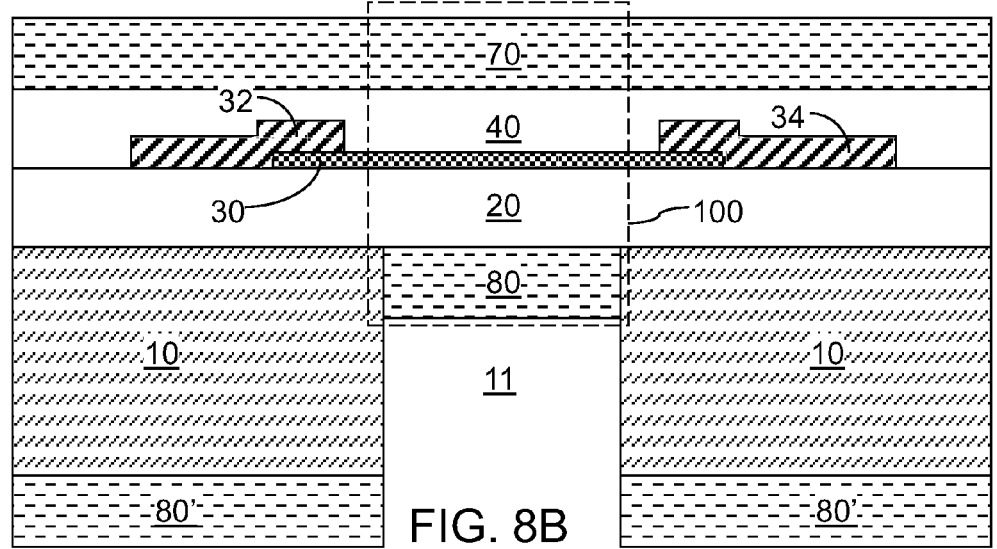
FIG. 8B is a vertical cross-sectional view of the first exemplary structure of FIG. 8A along the plane B-B' in FIG. 8A.

Referring to FIGS. 8A and 8B, a first partial mirror 80, a substrate partial mirror 80', and a second partial mirror 70 are formed on the first exemplary structure. The first partial mirror 80 is formed on the bottom surface of the first transparent layer 20, and the second partial mirror 70 is formed on the top surface of the second transparent layer 40. The substrate partial mirror 80' is formed on the back surface of the substrate 10.

Each of the first partial mirror 80, the substrate partial mirror 80', and the second partial mirror 70 includes a metal layer of a specific but not necessarily the same thickness or a reflective stack of alternating dielectric thin films having different indices of refraction. Non-limiting exemplary materials that can be employed for the first partial mirror 80, the substrate partial mirror 80', and the second partial mirror 70 include Ag, Au, Cu, Al, Ta, Ti, and a superlattice of silicon oxide and silicon nitride.

The composition of the metal layer or the reflective stack is selected so that the first partial mirror 80, the substrate partial mirror 80', and the second partial mirror 70 partially reflects electromagnetic radiation in the range between the first wavelength λ1 and the second wavelength λ2 (or at the common wavelength if the first wavelength λ1 is the same as the second wavelength λ2), and transmits a fraction of the electromagnetic radiation in that wavelength range. The reflectivity, i.e., the fraction of the reflected light relative to the incident light, of the first partial mirror 80 can be from 0.1 to 0.9, although lesser or greater values can be employed for the reflectivity.

The first partial mirror 80 and the substrate partial mirror 80' can be formed simultaneously by a deposition process that deposits a metal layer or a highly reflective stack of alternating dielectric thin films. For example, the first partial mirror 80 and the substrate partial mirror 80' can be deposited, for example, by vacuum evaporation, atomic layer deposition, chemical vapor deposition, physical vapor deposition, or a combination thereof. Depending on the deposition process employed, materials may, or may not, be deposited on the sidewalls of the trench 11.

The second partial mirror 70 can be formed before, simultaneously with, or after formation of the first partial mirror 80 and the substrate partial mirror 80'. The same type of deposition processes can be employed to deposit a metal layer or a highly reflective stack of alternating dielectric thin films for the second partial mirror 70.

Optionally, an optically transparent capping layer (not shown) can be formed over the first partial mirror 80 and second partial mirror 70 to protect the first partial mirror 80 and the second partial mirror 70 during subsequent handling or operation.

The stack of the first partial mirror 80, the first transparent layer 20, the second transparent layer 40, and the second partial mirror 70 constitutes an optical microcavity 100 that couples with electromagnetic radiation at a resonance wavelength λ. The first partial mirror 80 functions as a back-side partial mirror, and the second partial mirror 70 functions as a front-side partial mirror. If the first wavelength λ1 is the same as the second wavelength λ2, the resonance frequency λ is the same as the first wavelength λ1. If the first wavelength λ1 is not the same as the second wavelength λ2, the resonance frequency λ is between the first wavelength λ1 and the second wavelength λ2. In general, the resonance frequency λ is a frequency at which the electromagnetic radiation of the corresponding wavelength forms a standing wave between the first partial mirror 80 and the second partial mirror 70. If the percentage difference between the first wavelength λ1 and the second wavelength λ2 is small, the resonance frequency λ can be approximated by the mathematical average of the first wavelength λ1 and the second wavelength λ2, i.e., $\lambda \cong (\lambda 1 + \lambda 2)/2$.

In one embodiment, each of the first wavelength λ1 and the second wavelength λ2 can be substantially the same as the resonance frequency λ. In other words, four times the product of the first thickness t1 and the first index of refraction n1 can be substantially equal to the resonance wavelength λ, and four times the product of the second thickness t2 and the second index of refraction n2 can be substantially equal to the resonance wavelength λ. In one embodiment, each of the first wavelength λ1 and the second wavelength λ2 can be within 12.5% of the resonance frequency λ. In one embodiment, each of the first wavelength λ1 and the second wavelength λ2 can be within 5.0% of the resonance frequency λ. In one embodiment, each of the first wavelength λ1 and the second wavelength λ2 can be within 0.5% of the resonance frequency λ.

Electromagnetic radiation can pass through the microcavity (80, 20, 40, 70) only if the electromagnetic radiation satisfies a resonance condition that is determined by optical thickness of the stack of the first transparent layer 20 and the second transparent layer 40. The optical thickness of the stack of the first transparent layer 20 and the second transparent layer 40 is given by n1×t1+n2×t2. If the optical thickness of the stack of the first transparent layer 20 and the second transparent layer 40 equals integer multiples of one half of the resonance wavelength λ, the microcavity becomes optically transparent to that electromagnetic radiation.

Referring to FIGS. 9A and 9B, contact via structures are formed through the second partial mirror 70 and the optional optically transparent capping layer (not shown). The contact via structures include a first contact via structure 92 that contacts the first contact electrode 32 and a second contact via structure 94 that contacts the second contact electrode 34.

If the second partial mirror 70 includes at least one metallic material, a first dielectric liner 91 can be formed through the second partial mirror 70 and the optional optically transparent capping layer and around the first contact via structure 92. Likewise, a second dielectric liner 93 can be formed through the second partial mirror 70 and the optional optically transparent capping layer and around the second contact via structure 94. The first dielectric liner 91 and the second dielectric liner 93 can be formed by forming via cavities extending from the top surface of the second partial mirror 70 (or the top surface of the optional optically transparent capping layer, if present) to the top surfaces of the first and second contact electrodes (92, 94), depositing a dielectric material liner, and anisotropically etching horizontals of the dielectric material liner. Remaining portions of the dielectric material liner constitute the first and second dielectric liners (91, 93).

The first contact via structure 92 and the second contact via structure 94 can be formed by filling the via cavities with a conductive material, and removing any excess conductive material from above the top surface of the second partial mirror 70 (or the top surface of the optional optically transparent capping layer, if present). The first contact via structure 92 and the second contact via structure 94 provide electrical contact to the first and second contact electrodes (32, 34), respectively.

Figure 10:
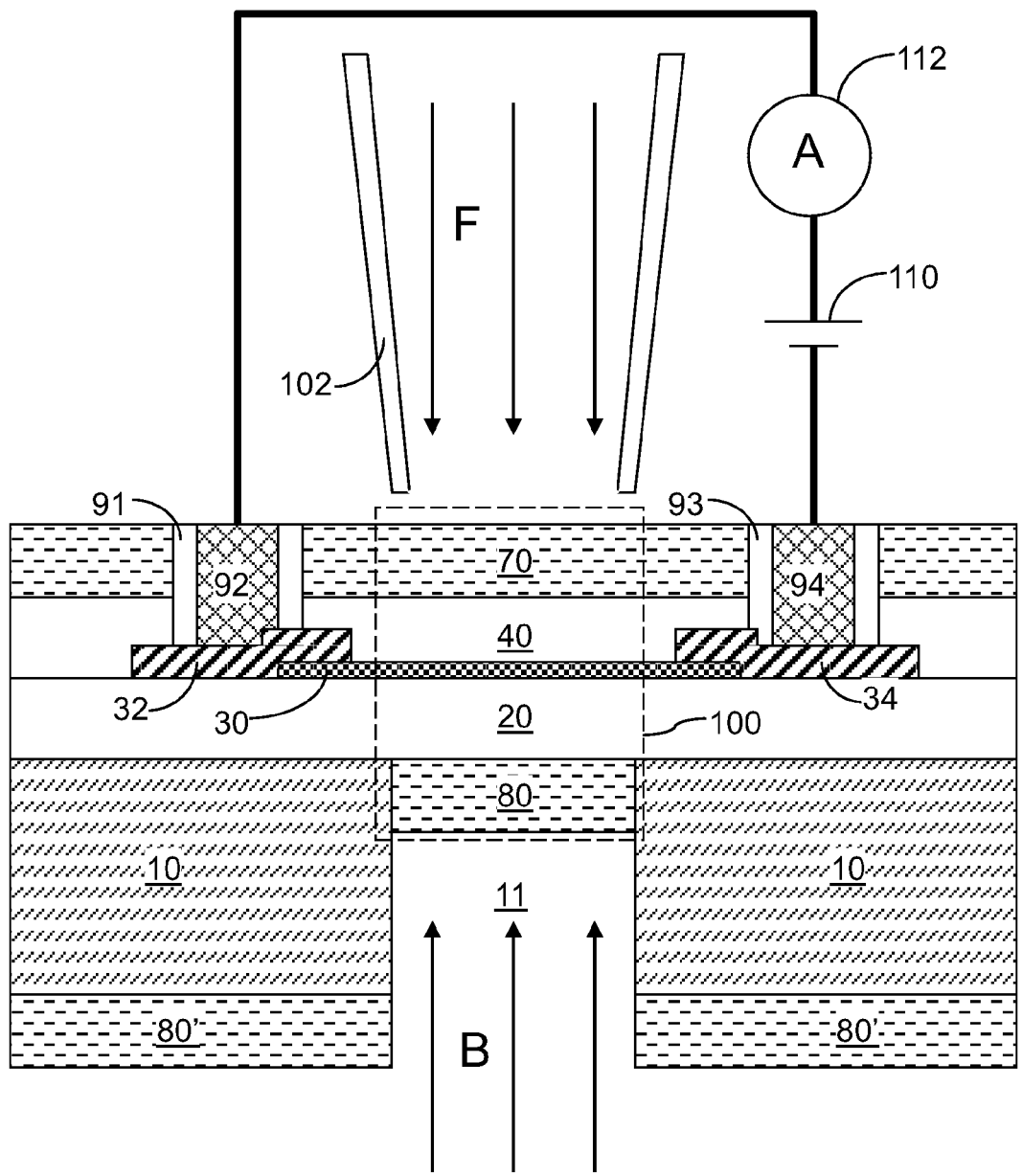
FIG. 10 is a schematic view of a first exemplary structure after formation of a first bias and current measurement circuit for operation of the first exemplary structure as a light detector according to the first embodiment of the present disclosure.

Referring to FIG. 10, a first bias and current measurement circuit is attached across the first and second contact via structures (92, 94) for operation of the first exemplary structure as a light detector, i.e., an electromagnetic radiation detector. The first bias and current measurement circuit includes a direct current voltage bias source 110, which can be a battery or any other constant voltage generator, and a current measurement device 112, which can be configured to measure any current that passes through the at least one graphene layer 30. The current measurement device 112 can be configured to measure instantaneous current flow in any direction.

The second contact electrode 34 is electrically biased relative to the first contact electrode 32 with a direct current (DC) voltage bias, i.e., a constant voltage bias. The DC voltage bias can be a positive voltage or a negative voltage. The magnitude of the DC voltage bias can be from 0.1 V to 100 V, although lesser and greater DC voltage bias can also be employed.

The first bias and current measurement circuit is configured to measure electrical current that passes through the at least one graphene layer 30 upon irradiation of the at least one graphene layer 30 with electromagnetic radiation. The efficiency of coupling of the electromagnetic radiation is dependent upon the wavelength of the electromagnetic radiation, and is at a maximum at the resonance frequency λ. The Q-factor for the coupling, i.e., the narrowness of the width of the range of wavelength relative to the resonance frequency λ, is dependent upon the reflectivity of the first and second partial mirrors (80, 70). Thus, electrical photo-generated current flows through the at least one graphene layer 30 only when the wavelength of the electromagnetic radiation incident upon the optical microcavity is at the resonance frequency λ or around the resonance frequency λ such that the deviation of the wavelength of electromagnetic radiation from the resonance frequency λ is less than, or on the order of λ/Q, in which Q is the value of the Q-factor for the optical microcavity.

If an external electric field is applied and/or an electrical current flows through the at least one graphene layer 30, the optical properties of the optical microcavity changes reversibly. The property changes of the at least one graphene layer 30, which is an intra-cavity optical medium, cause a modification of the optical properties of the optical device including the at least one graphene layer 30 and the microcavity, resulting in an angular and spectral redistribution, or filtering, of the electromagnetic radiation. This is the operational principle for microcavity-controlled switching and multiplexing of electromagnetic radiation.

The current measurement device 112 can measure the presence or the magnitude of any additional current that flows in the at least one graphene layer 30 as a result of the microcavity-assisted absorption of electromagnetic radiation at, or near, the resonance wavelength λ. Thus, the first exemplary structure can be employed as an electromagnetic radiation detector for a narrow band of wavelength centered at the resonance wavelength λ.

The electromagnetic radiation detector can detect light that impinges on the optical cavity from the front side F, or from the back side B. Optionally, a light shield 102 can be provided to filter out electromagnetic radiation that is outside a predetermined spherical angle.

Figure 11:
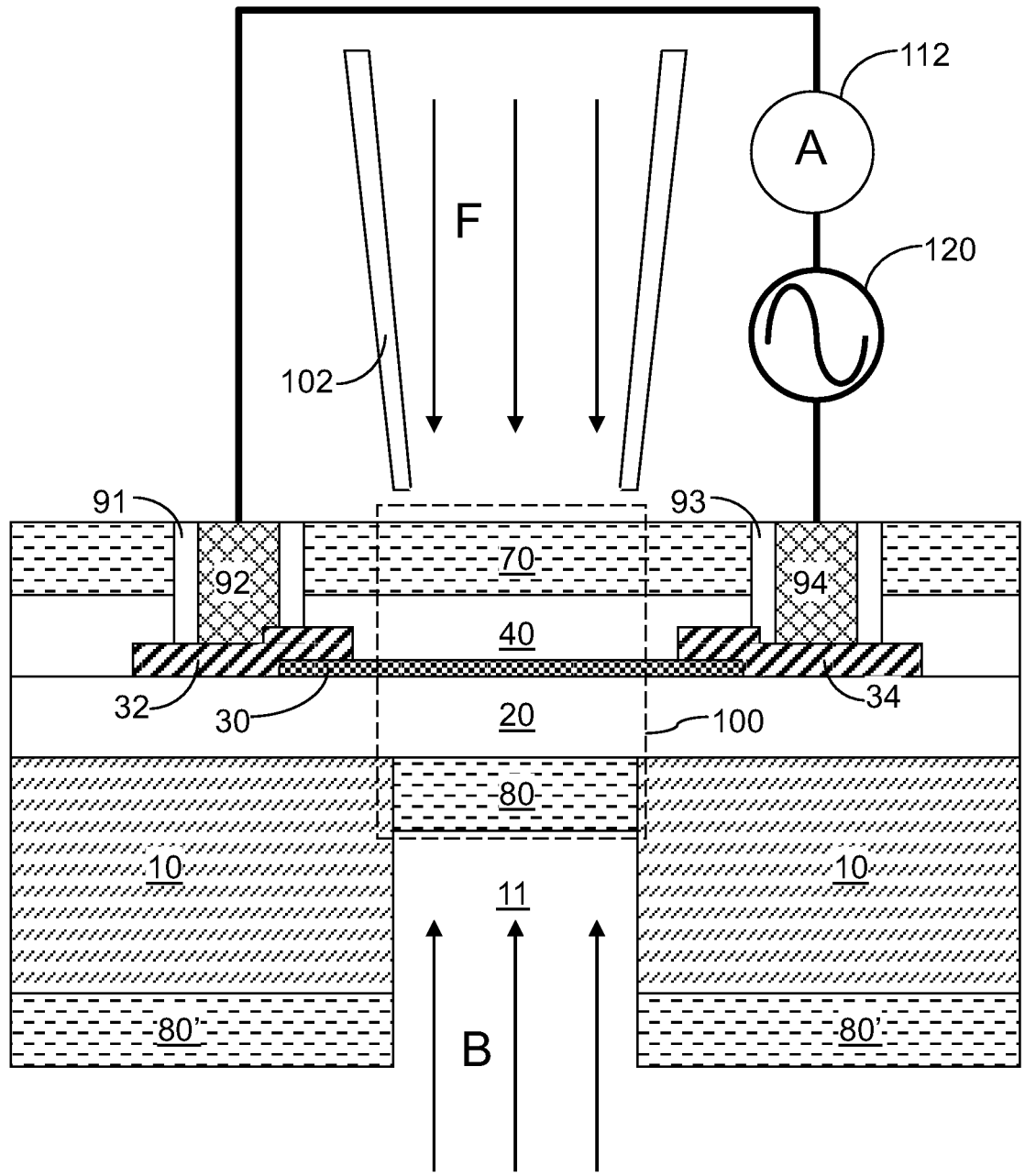
FIG. 11 is a schematic view of a second exemplary structure, which is derived from the first exemplary structure of FIGS. 9A and 9B, after formation of a second bias and current measurement circuit for operation of the second exemplary structure as a light detector according to a second embodiment of the present disclosure.

Referring to FIG. 11, the first bias and current measurement circuit of the first exemplary structure can be replaced with a second bias and current measurement circuit to provide a second exemplary structure. In the second bias and current measurement circuit, the direct current voltage bias source 110 in the first bias and current measurement circuit is replaced with an alternating current voltage bias source 120, which applies an alternating current (AC) voltage bias across the at least one graphene layer 30 instead of a DC voltage bias. The amplitude of the AC voltage bias can be from 0.1 V to 100 V, and the frequency of the AC voltage bias can be from 1 Hz to 1 THz, although lesser and greater amplitudes and frequencies can also be employed. The second exemplary structure can be employed as an electromagnetic radiation detector as in the first embodiment.

Figure 12:
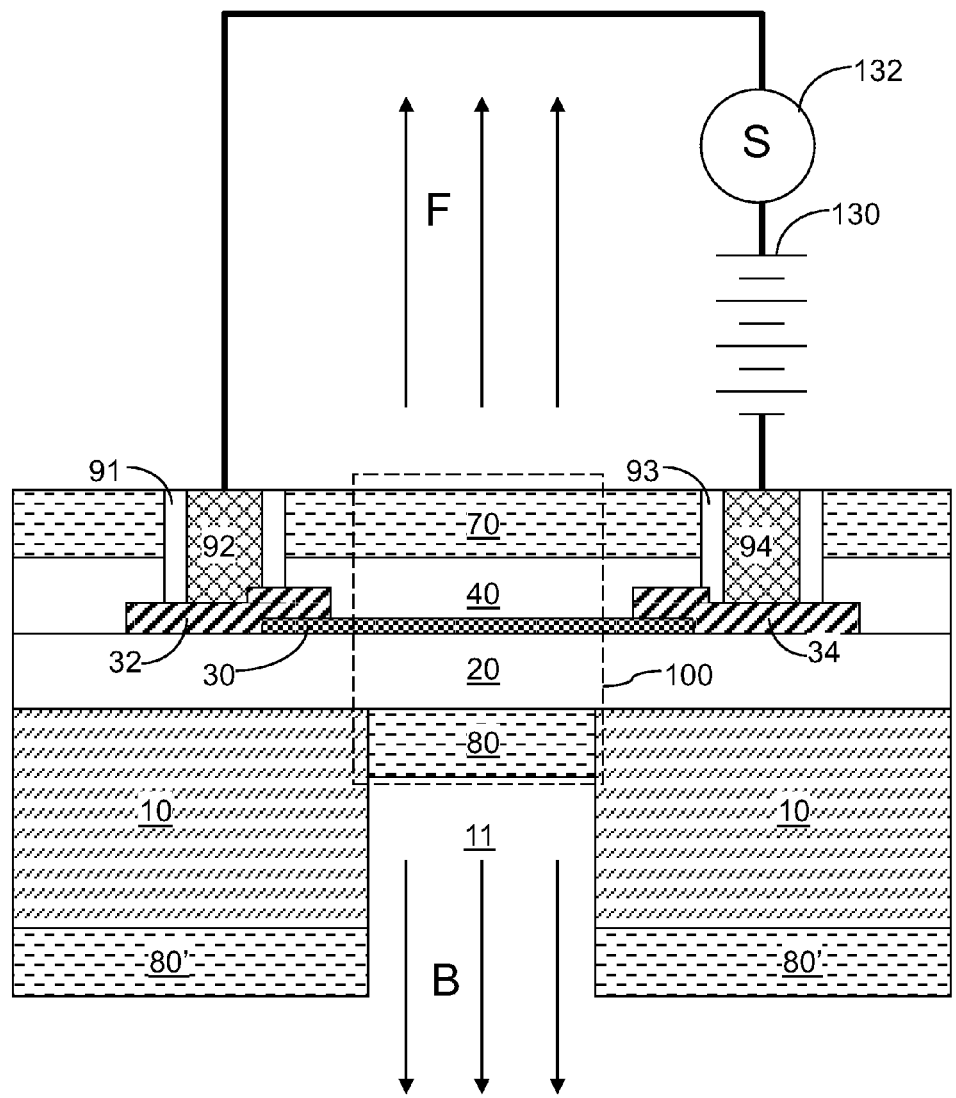
FIG. 12 is a schematic view of a third exemplary structure, which is derived from the first exemplary structure of FIGS. 9A and 9B, after formation of a first bias and switching circuit for operation of the third exemplary structure as a light emitter according to a third embodiment of the present disclosure.

Referring to FIG. 12, a third exemplary structure can be derived from the first exemplary structure of FIGS. 10A and 10B by replacing the first bias and current measurement circuit with a first bias and switching circuit. The first bias and switching circuit includes a direct current (DC) voltage bias source 130 and a circuit switch 132, which closes or opens the electrical circuit of a series connection of the DC voltage bias source 130, the first contact structure 92, the first contact electrode 32, the at least one graphene layer 30, the second contact electrode 34, and the second contact structure 94. While the circuit switch 132 is closed, a direct current (DC) electrical current flows through the at least one graphene layer 30. The electrical current causes the at least one graphene layer 30 to emit light at various wavelengths. Only the electromagnetic radiation having wavelengths at which the optical microcavity is transparent can be emitted from the optical cavity. The wavelength range in which the electromagnetic radiation can escape the optical microcavity includes the wavelength range centered at the resonance wavelength $\lambda$. The third exemplary structure can operate as an electromagnetic radiation emitter that emits electromagnetic radiation only within a predetermined wavelength range centered around the resonance wavelength $\lambda$ while direct current (DC) electrical current passes through the at least one graphene layer 30.

Thus, electromagnetic radiation can be generated by an electrical current flowing through the at least one graphene layer 30. The electromagnetic radiation is coupled with high efficiency to internal photonic modes, i.e., the standing wave models that are provided by the optical microcavity. The integrated graphene-based microcavity emitter is an optoelectronic device that is configured to emit a spectrally narrow and highly directional light.

Electromagnetic field confinement in a microcavity with a mirror spacing below one emission wavelength provides selective enhancement of the radiative emission rate of the at least one graphene layer 30 enclosed within the microcavity due to the Purcell Effect. Specifically, in the case of terahertz emission or thermal management applications for high-performance graphene transistors, the mirror spacing of the microcavity can be designed to match the resonance energy of principal lattice vibrations (phonons) in the at least one graphene sheet 30.

Figure 13:
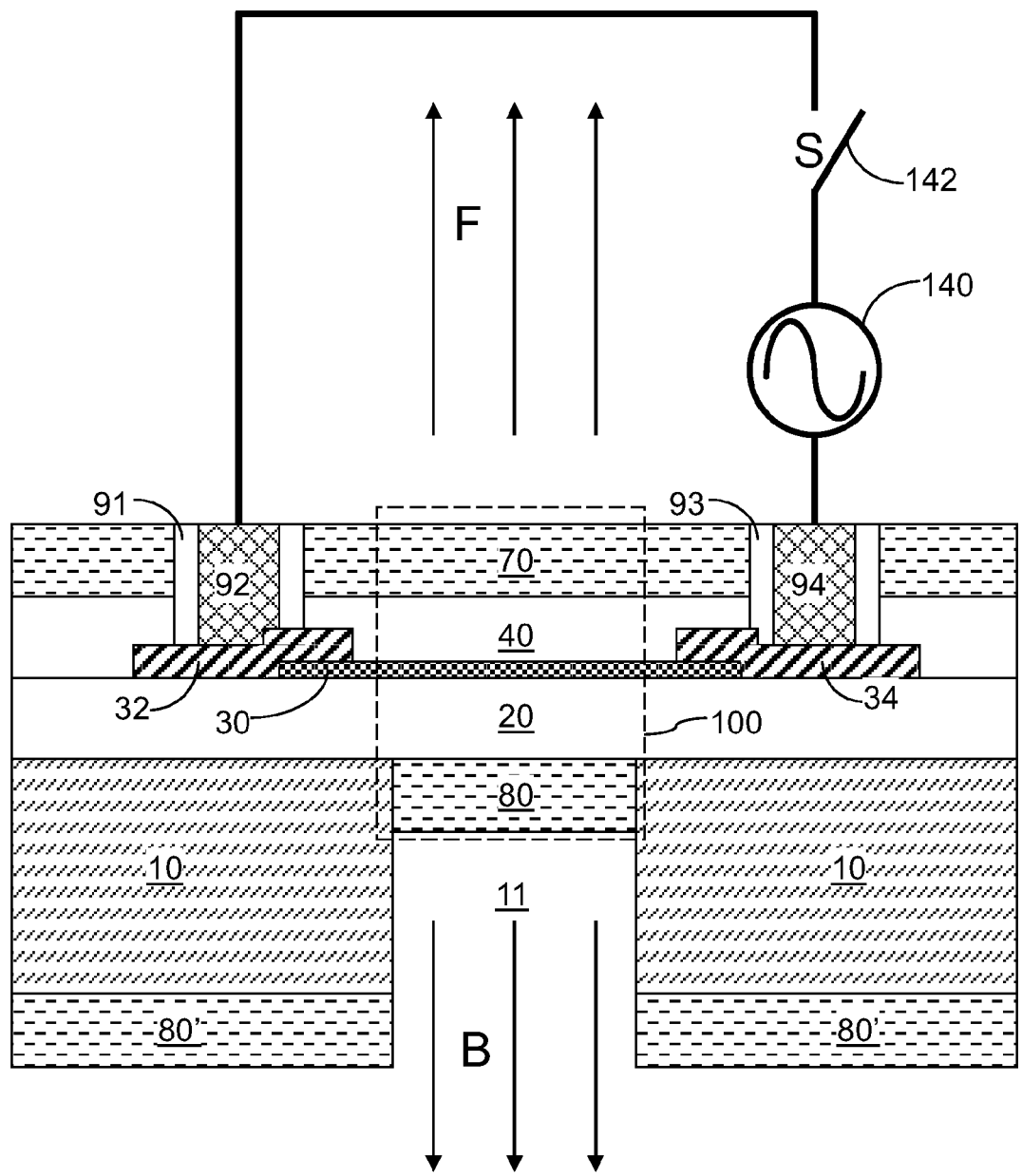
FIG. 13 is a schematic view of a fourth exemplary structure, which is derived from the first exemplary structure of FIGS. 9A and 9B, after formation of a second bias and switching circuit for operation of the fourth exemplary structure as a light emitter according to a fourth embodiment of the present disclosure.

Referring to FIG. 13, the first bias and switching circuit of the third exemplary structure can be replaced with a second bias and switching circuit to provide a fourth exemplary structure. In the second bias and switching circuit, the DC voltage bias source 130 in the first bias and switching circuit is replaced with an alternating current voltage bias source 140, which applies an alternating current (AC) voltage bias across the at least one graphene layer 30 instead of a DC voltage bias. The amplitude of the AC voltage bias can be from 0.1 V to 100 V, and the frequency of the AC voltage bias can be from 1 Hz to 1 THz, although lesser and greater amplitudes and frequencies can also be employed. The fourth exemplary structure can be employed as an electromagnetic radiation emitter as in the third embodiment.

Figure 14:
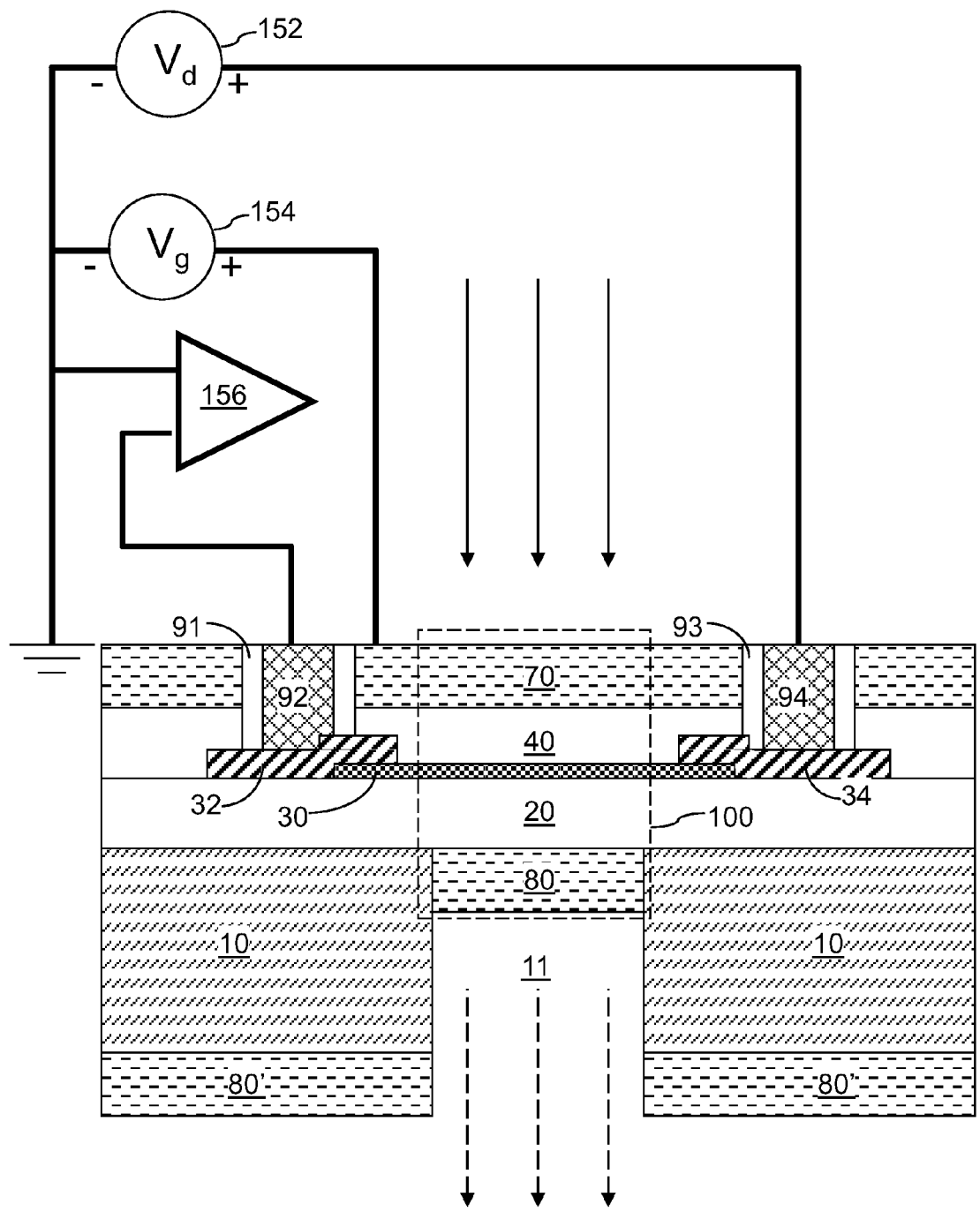
FIG. 14 is a schematic view of a fifth exemplary structure, which is derived from the first exemplary structure of FIGS. 9A and 9B, after formation of a bias and signal amplification circuit for operation of the fifth exemplary structure as a light modulator according to a fifth embodiment of the present disclosure.

Referring to FIG. 14, a fifth exemplary structure is derived from the first exemplary structure of FIGS. 9A and 9B by connecting a bias and signal amplification circuit. The bias and signal amplification circuit includes a direct current (DC) drain voltage bias circuit 152, a direct current (DC) gate voltage bias circuit 154, and a signal amplification circuit 156. The DC drain voltage bias circuit 152 applies a DC voltage bias across the first contact electrode 32 and the second contact electrode 34, i.e., across the at least one graphene layer 30. The DC gate voltage bias circuit 154 applies another DC voltage bias across one of the first contact electrode 32 and the second contact electrode 34 and one of the first partial mirror 80 and the second partial mirror 70.

The electrical current through the at least one graphene layer 30 can be modulated in a manner similar to current control in a field effect transistor. Specifically, the DC bias voltage applied by the DC drain voltage bias circuit 152 is analogous to a drain-to-source bias voltage, and the DC bias voltage applied by the DC gate voltage bias circuit 154 is analogous to a gate-to-source voltage. The electrical current through the at least one graphene layer 30 is analogous to a drain-to-source electrical current. The electrical current through the at least one graphene layer 30 can be detected by the signal amplification circuit 156, which can include, for example, an operational amplifier.

By modulating the electrical current through the at least one graphene layer 30, the optical properties of the microcavity can be changed. Thus, in the absence of the electrical current through the at least one graphene layer 30, the microcavity can be transparent at the resonance wavelength $\lambda$. By causing the electrical current to flow within the at least one graphene layer 30, the microcavity can become opaque at the resonance wavelength $\lambda$. Thus, the fifth exemplary structure can be employed as an electromagnetic radiation modulator that modulates the transmission of light in a narrow wavelength range centered around the resonance wavelength $\lambda$ through modulation of electrical current through the at least one graphene layer 30. The transmission coefficient of electromagnetic radiation passing through the microcavity is modulated by electrical current passing through the at least one graphene layer 30. The transmission coefficient is wavelength-dependent, and is at a maximum at the resonance wavelength $\lambda$ while electrical current does not pass through the at least one graphene layer 30.

In general, each of the at least one graphene layer in any of the first, second, third, fourth, and fifth exemplary structures can be replaced with at least one carbon nanotube to provide optoelectronic devices that provide a same function, provided that the first contact electrode 32 and the second contact electrode 34 are formed on opposite ends of each carbon nanotube.

Figure 15A:
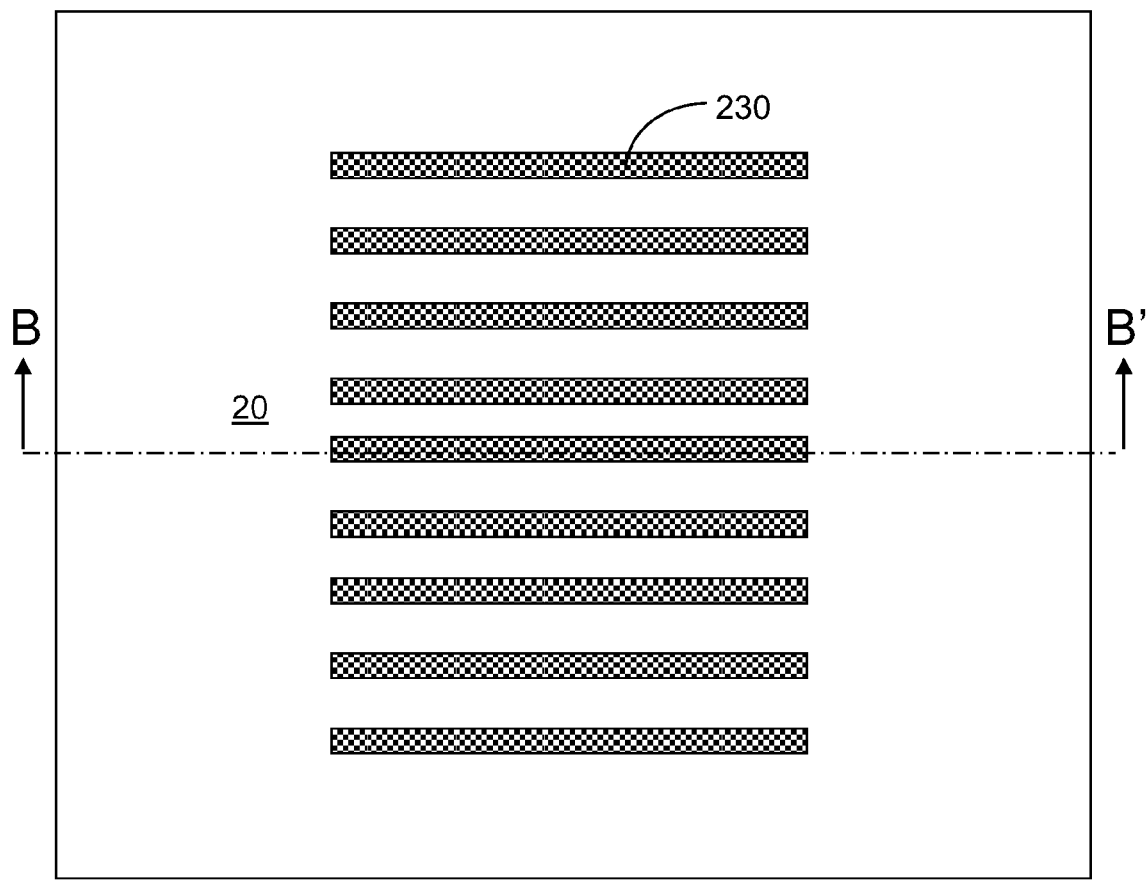
FIG. 15A is a top-down view of a sixth exemplary structure that is derived from the first exemplary structure of FIGS. 2A and 2B by placing at least one carbon nanotube on the first transparent layer according to a sixth embodiment of the present disclosure.
Figure 15B:
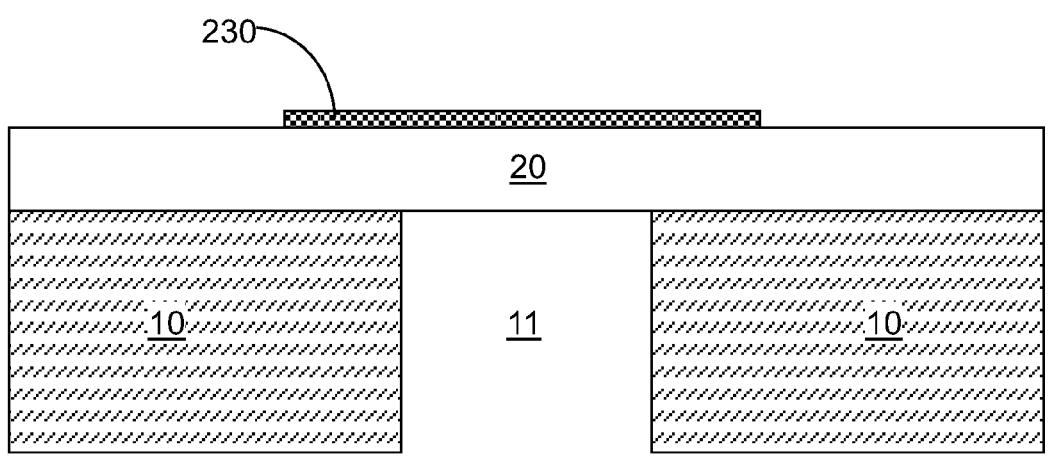
FIG. 15B is a vertical cross-sectional view of the sixth exemplary structure of FIG. 15A along the plane B-B' in FIG. 15A.
Figure 16A:
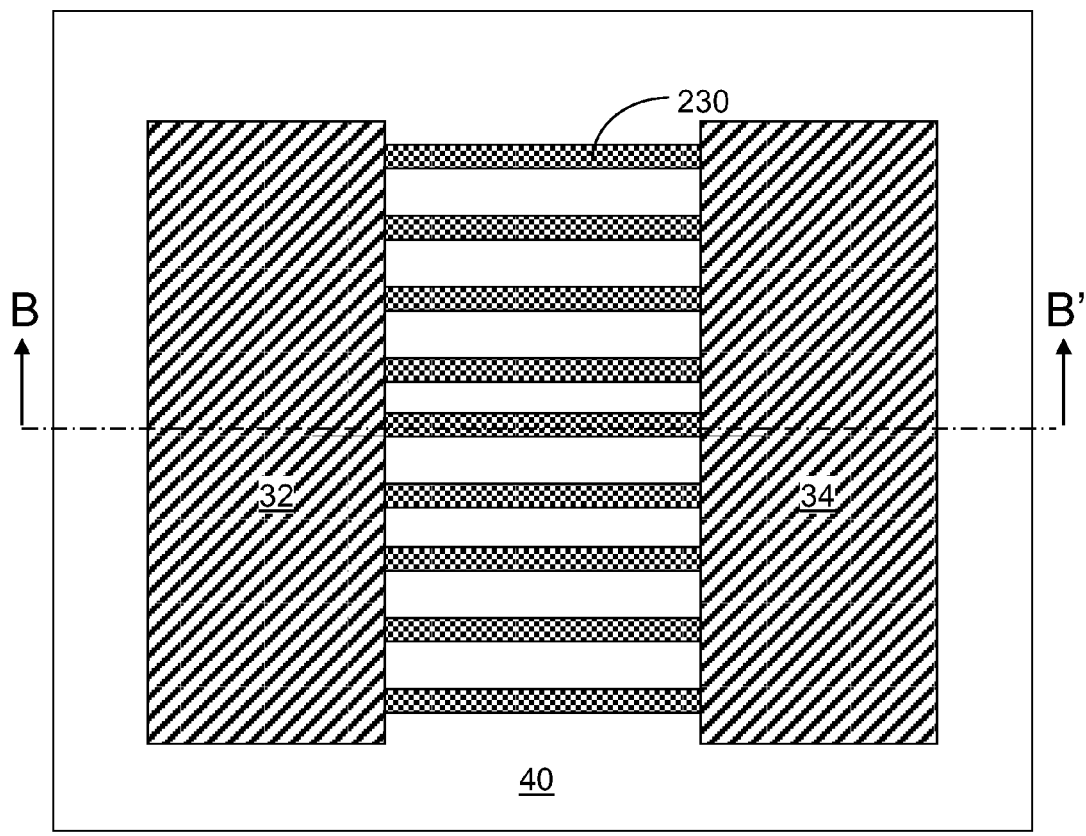
FIG. 16A is a top-down view of the sixth exemplary structure after formation of a second transparent layer according to the sixth embodiment of the present disclosure.
Figure 16B:
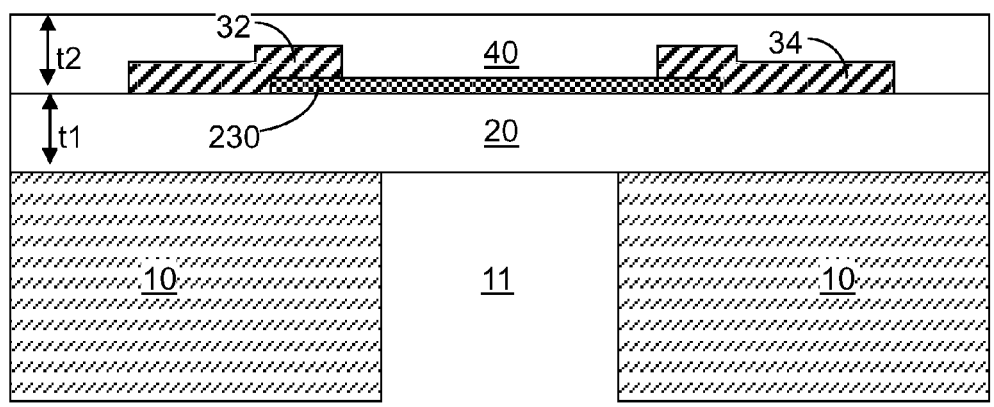
FIG. 16B is a vertical cross-sectional view of the sixth exemplary structure of FIG. 16A along the plane B-B' in FIG. 16A.

Referring to FIGS. 15A and 15B, a sixth exemplary structure according to a sixth embodiment of the present disclosure can be derived from the first exemplary structure of FIGS. 2A and 2B by placing at least one carbon nanotube 230 on the first transparent layer 20 in lieu of at least one graphene layer 30. If the at least one carbon nanotube 230 is a plurality of carbon nanotubes, the plurality of carbon nanotubes can be aligned employing any method known in the art. Subsequently, processing steps of FIGS. 4A, 4B, 5A, 5B, 6A, 6B, 7A, and 7B can be performed to provide the sixth exemplary structure illustrated in FIGS. 16A and 16B.

Figure 17:
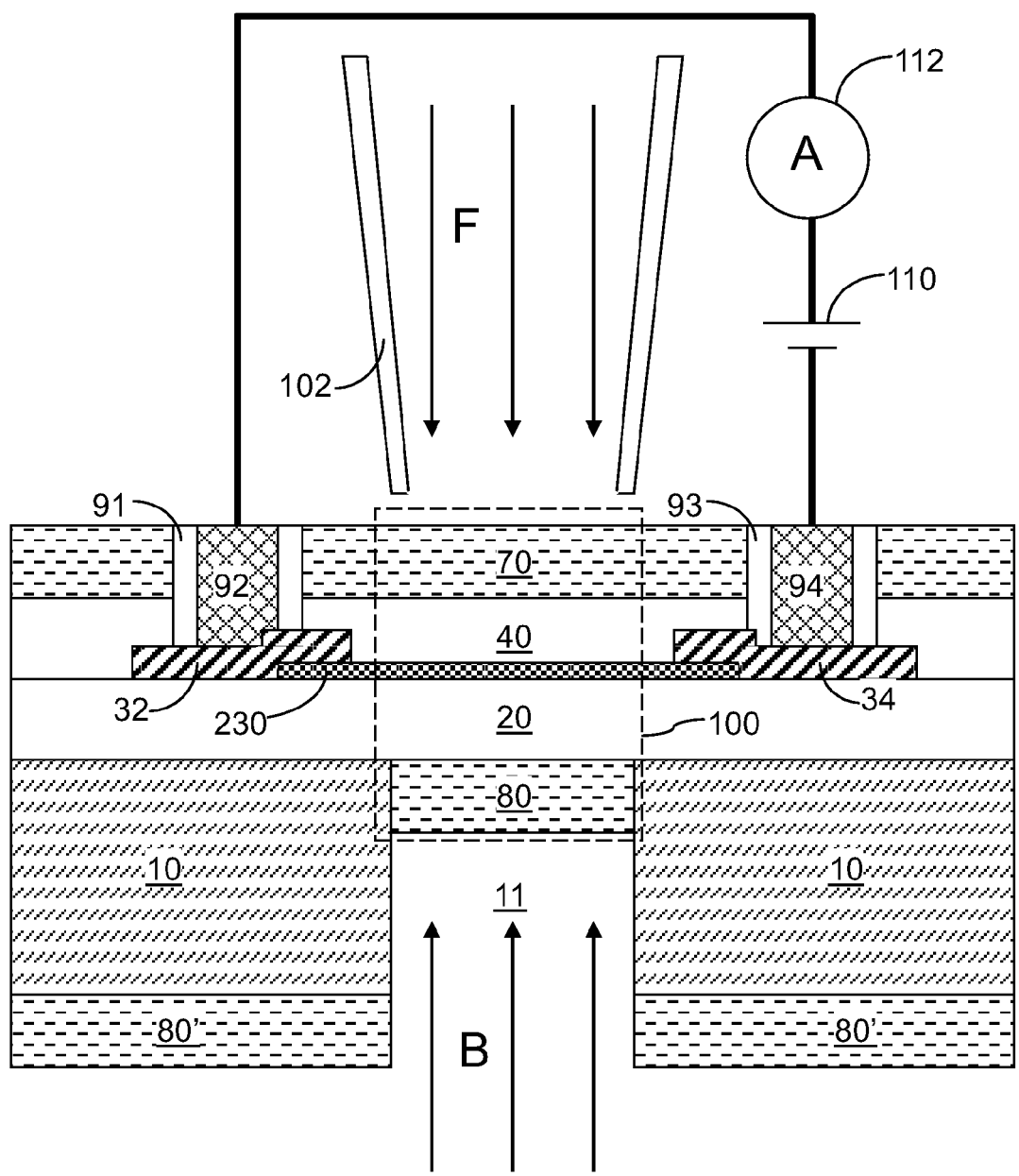
FIG. 17 is a schematic view of the sixth exemplary structure after formation of a first bias and current measurement circuit for operation of the sixth exemplary structure as a light detector according to the sixth embodiment of the present disclosure.

Processing steps of FIGS. 8A, 8B, 9A, 9B, and 10 can be subsequently performed to provide the sixth exemplary structure of FIG. 17. The sixth exemplary structure of FIG. 17 is an electromagnetic radiation detector having the same operational principle as the electromagnetic radiation detector of FIG. 10 except for the difference of employing at least one carbon nanotube 230 instead of the at least one graphene layer 30.

Figure 18:
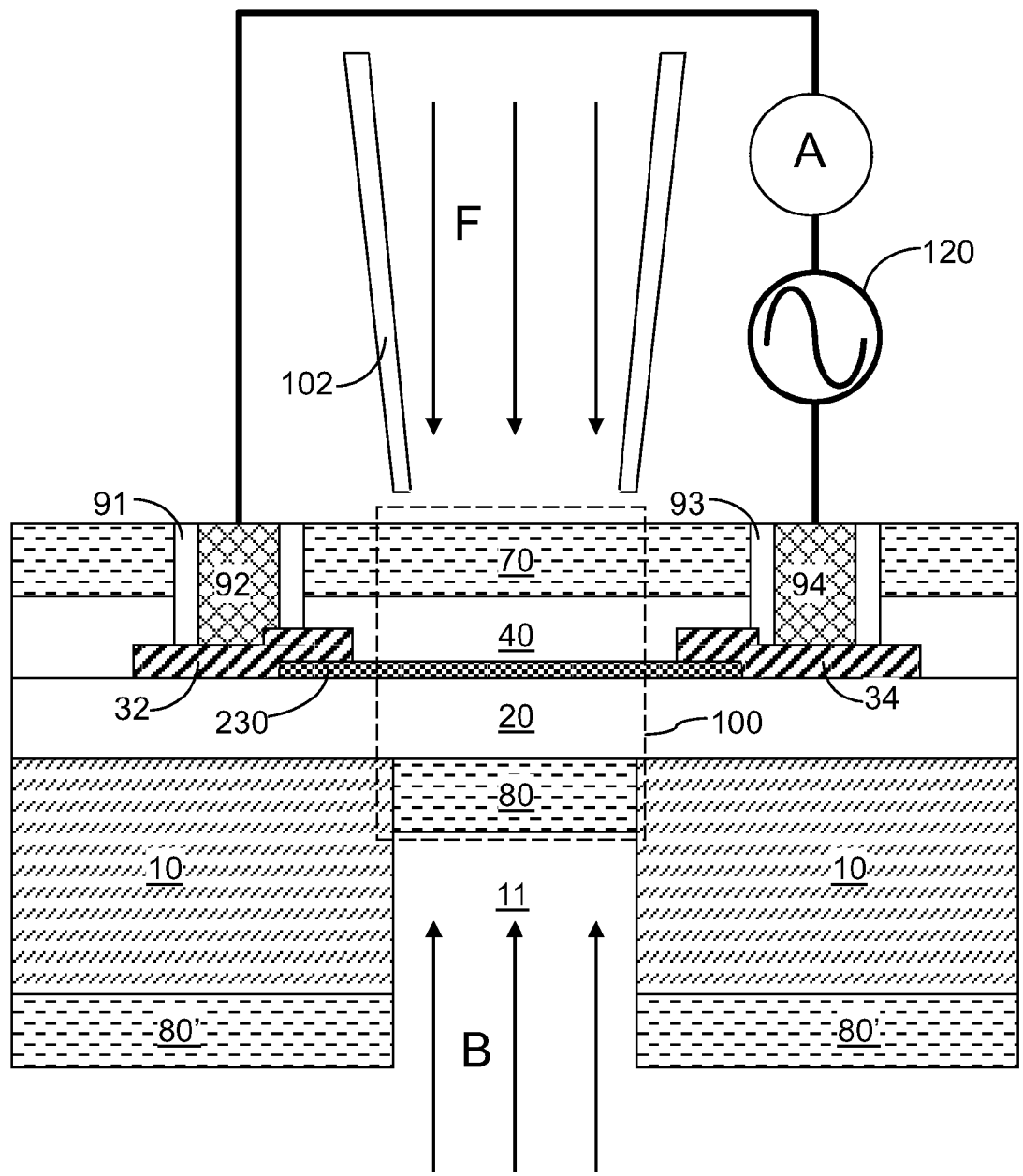
FIG. 18 is a schematic view of a seventh exemplary structure, which is derived from the sixth exemplary structure of FIGS. 16A and 16B, after formation of a second bias and current measurement circuit for operation of the seventh exemplary structure as a light detector according to a seventh embodiment of the present disclosure.

A seventh exemplary structure illustrated in FIG. 18 can be derived from the second exemplary structure of FIG. 11 by replacing the at least one graphene layer 30 with at least one carbon nanotube 230. The seventh exemplary structure of FIG. 18 is an electromagnetic radiation detector having the same operational principle as the electromagnetic radiation detector of FIG. 11.

Figure 19:
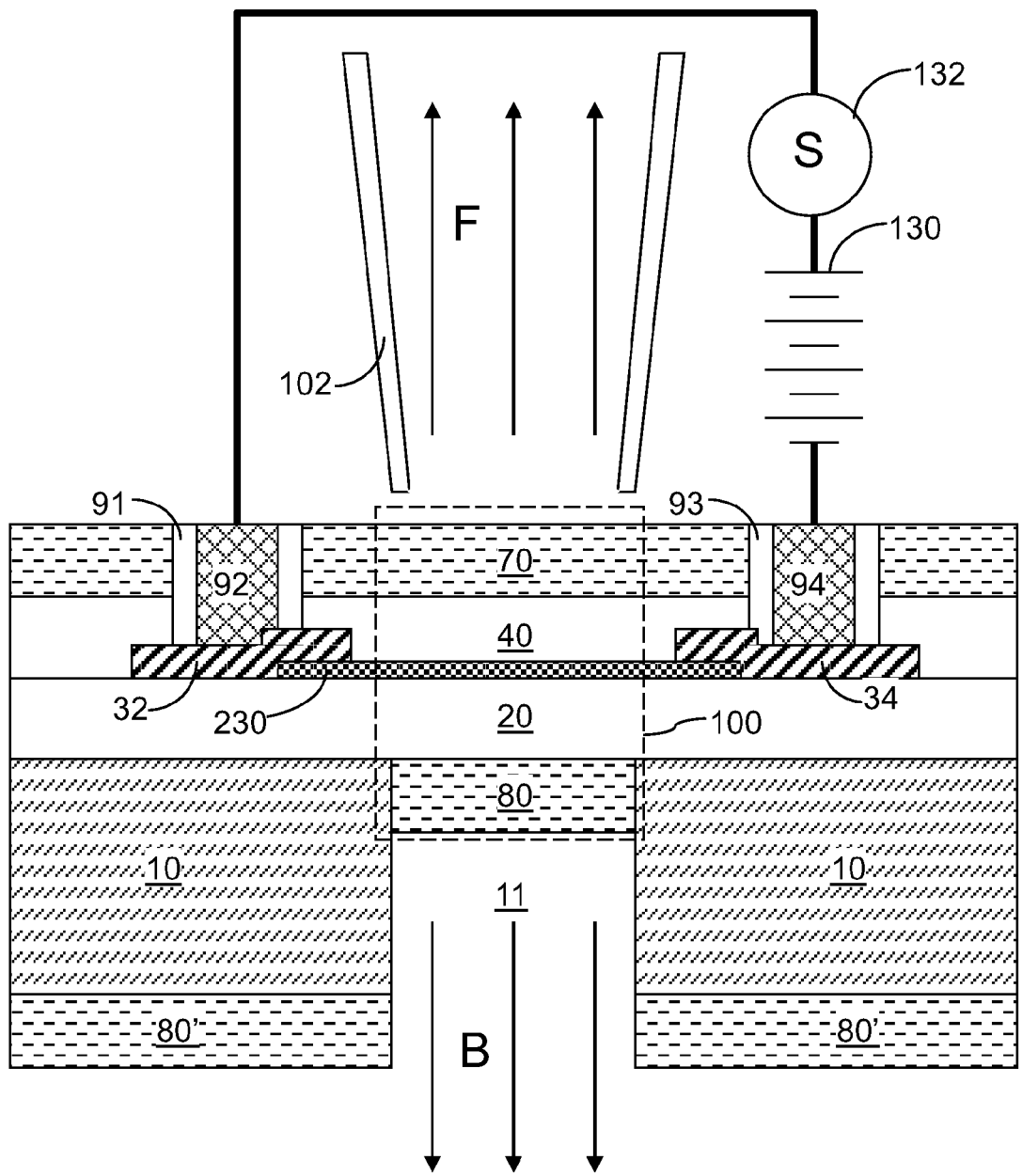
FIG. 19 is a schematic view of an eighth exemplary structure, which is derived from the sixth exemplary structure of FIGS. 16A and 16B, after formation of a first bias and switching circuit for operation of the eighth exemplary structure as a light emitter according to an eighth embodiment of the present disclosure.

An eighth exemplary structure illustrated in FIG. 19 can be derived from the third exemplary structure of FIG. 12 by replacing the at least one graphene layer 30 with at least one carbon nanotube 230. The eighth exemplary structure of FIG. 19 is an electromagnetic radiation emitter having the same operational principle as the electromagnetic radiation emitter of FIG. 12.

Figure 20:
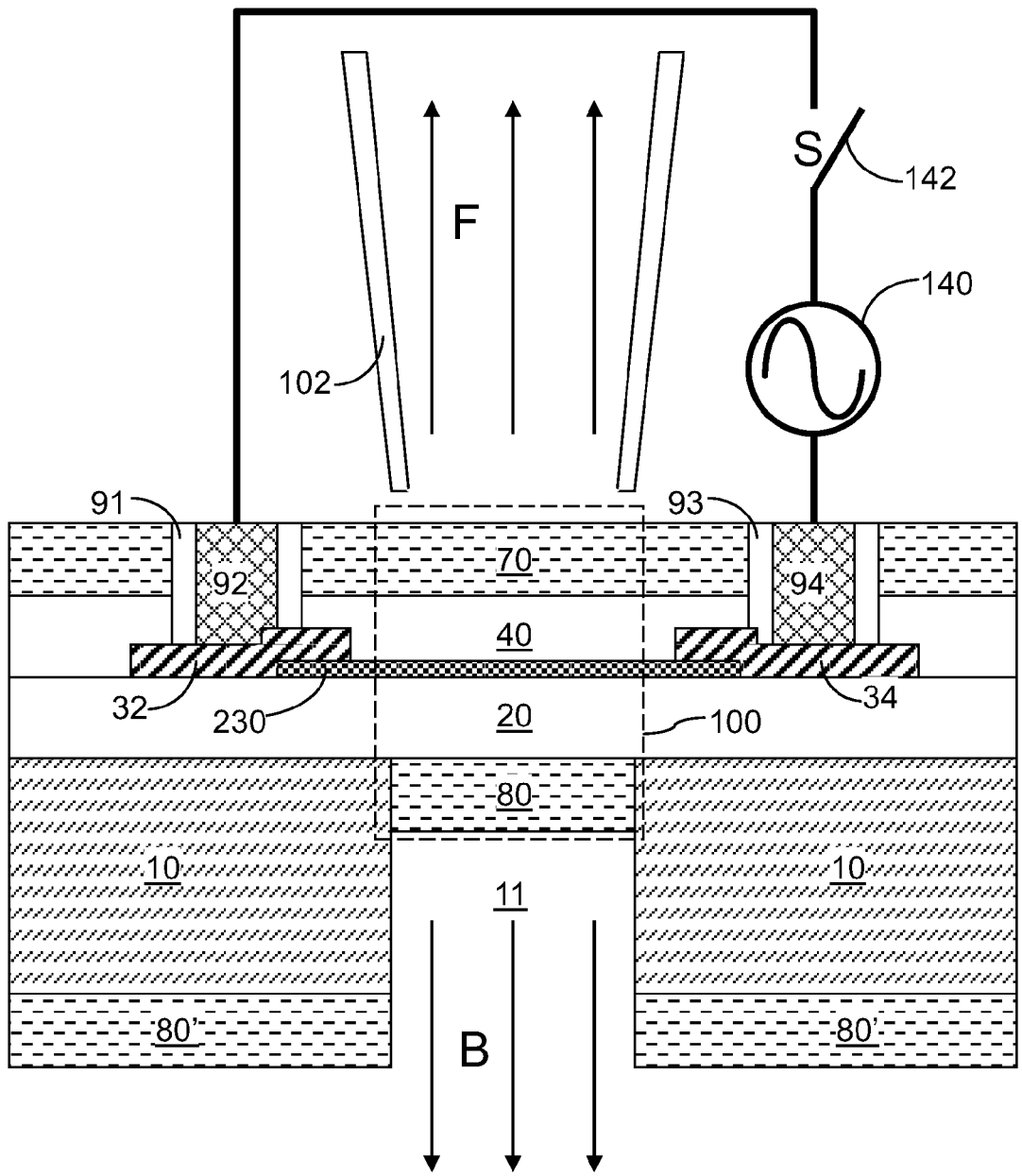
FIG. 20 is a schematic view of a ninth exemplary structure, which is derived from the sixth exemplary structure of FIGS. 16A and 16B, after formation of a second bias and switching circuit for operation of the ninth exemplary structure as a light emitter according to a ninth embodiment of the present disclosure.

A ninth exemplary structure illustrated in FIG. 20 can be derived from the forth exemplary structure of FIG. 13 by replacing the at least one graphene layer 30 with at least one carbon nanotube 230. The ninth exemplary structure of FIG. 20 is an electromagnetic radiation emitter having the same operational principle as the electromagnetic radiation emitter of FIG. 13.

Figure 21:
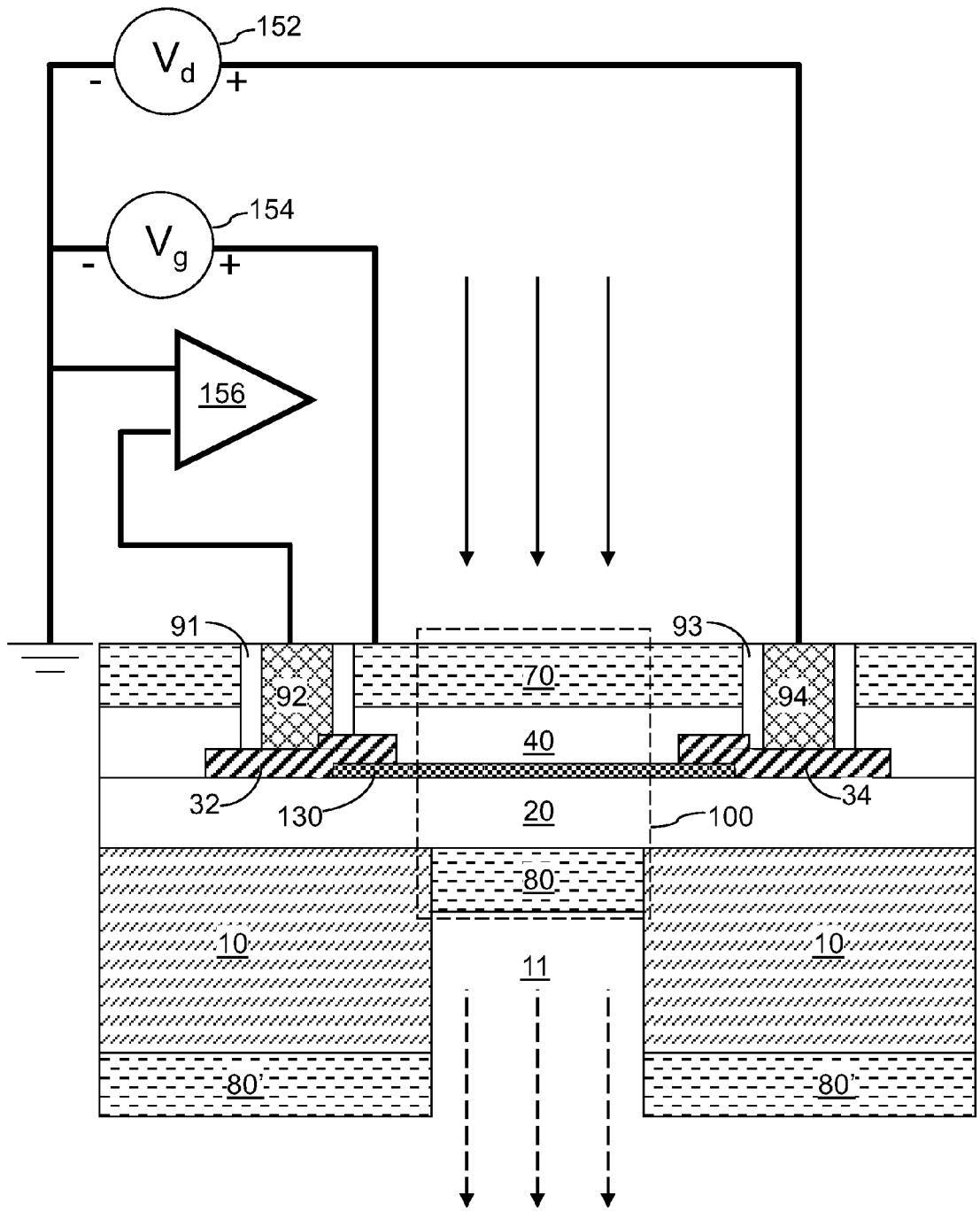
FIG. 21 is a schematic view of a tenth exemplary structure, which is derived from the sixth exemplary structure of FIGS. 16A and 16B, after formation of a bias and signal amplification circuit for operation of the tenth exemplary structure as a light modulator according to a tenth embodiment of the present disclosure.

A tenth exemplary structure illustrated in FIG. 21 can be derived from the fifth exemplary structure of FIG. 14 by replacing the at least one graphene layer 30 with at least one carbon nanotube 230. The tenth exemplary structure of FIG. 21 is an electromagnetic radiation modulator having the same operational principle as the electromagnetic radiation emitter of FIG. 14.

The methods of the present disclosure employ scalable, CMOS-compatible processes to provide an optoelectronic device employing a two-dimensional lattice structure. The disclosed optoelectronic devices consume less power and have smaller footprints compared with known optoelectronic devices known in the art. Further, the disclosed optoelectronic devices can provide a high operating speed across the entire electromagnetic spectral range as long as the dimensions of the microcavity can be adjusted to provide a matching resonance wavelength.

Applications of the devices of the present disclosure include, but are not limited to, microcavity-controlled multiplexers, switches, detectors, and emitters of electromagnetic radiation operating in the visible, the infrared, and the terahertz spectral regime. Also, the method of the present disclosure can be adapted for the thermal management of high-performance electronic devices, such as field effect transistors, that employs a two-dimensional lattice structure.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. An electromagnetic radiation detector comprising:
a stack, from bottom to top, of a first partial mirror, a first transparent layer, a second transparent layer, and a second partial mirror;
at least one two-dimensional carbon lattice structure embedded in said second transparent layer;
a first contact electrode in contact with one end of said at least one two-dimensional carbon lattice structure and embedded within said second transparent layer;
a second contact electrode in contact with an opposite end of said at least one two-dimensional carbon lattice structure and embedded within said second transparent layer; and
a circuit connected across said first contact electrode and said second contact electrode and configured to provide an electrical bias voltage across said first contact electrode and said second contact electrode and to measure electrical current that passes through said at least one two-dimensional carbon lattice structure upon irradiation of said at least one two-dimensional carbon lattice structure with electromagnetic radiation.

2. The electromagnetic radiation detector of claim 1, wherein said first transparent layer has a first thickness and a first index of refraction at a wavelength of the electromagnetic radiation, and said second transparent layer has a second thickness and a second index of refraction at said wavelength, and a product of said second thickness and said second index of refraction is within 25% of a product of said first thickness and said first index of refraction.

3. The electromagnetic radiation detector of claim 1, wherein said at least one two-dimensional carbon lattice structure has a bottom surface that is coplanar with an interface between said first transparent layer and said second transparent layer.

4. The electromagnetic radiation detector of claim 3, wherein each of said first contact electrode and said second contact electrode has a bottommost surface that is coplanar with said interface.

5. The electromagnetic radiation detector of claim 1, wherein said stack constitutes an optical microcavity that couples with electromagnetic radiation at a resonance wavelength $\lambda$, wherein said first transparent layer has a first thickness t1 and a first index of refraction n1 at said resonance wavelength $\lambda$, and said second transparent layer has a second thickness t2 and a second index of refraction n2 at said resonance wavelength $\lambda$, and four times a product of said first thickness t1 and said first index of refraction is substantially equal to said resonance wavelength $\lambda$, and four times a product of said second thickness t2 and said second index of refraction is substantially equal to said resonance wavelength $\lambda$.

6. The electromagnetic radiation detector of claim 1, wherein said at least one two-dimensional carbon lattice structure includes at least one of a graphene layer or a carbon nanotube.

7. An electromagnetic radiation emitter comprising:
a stack, from bottom to top, of a first partial mirror, a first transparent layer, a second transparent layer, and a second partial mirror;
at least one two-dimensional carbon lattice structure embedded in said second transparent layer;
a first contact electrode in contact with one end of said at least one two-dimensional carbon lattice structure and embedded within said second transparent layer;
a second contact electrode in contact with an opposite end of said at least one two-dimensional carbon lattice structure and embedded within said second transparent layer; and
a circuit connected across said first contact electrode and said second contact electrode and configured to provide an electrical bias voltage across said first contact electrode and said second contact electrode and to switch electrical current that passes through said at least one two-dimensional carbon lattice structure, wherein electromagnetic radiation is emitted from said at least one two-dimensional carbon lattice structure while electrical current passes through said at least one two-dimensional carbon lattice structure.

8. The electromagnetic radiation emitter of claim 7, wherein said first transparent layer has a first thickness and a first index of refraction at a wavelength of the electromagnetic radiation, and said second transparent layer has a second thickness and a second index of refraction at said wavelength, and a product of said second thickness and said second index of refraction is within 25% of a product of said first thickness and said first index of refraction.

9. The electromagnetic radiation emitter of claim 7, wherein said at least one two-dimensional carbon lattice structure has a bottom surface that is coplanar with an interface between said first transparent layer and said second transparent layer.

10. The electromagnetic radiation emitter of claim 9, wherein each of said first contact electrode and said second contact electrode has a bottommost surface that is coplanar with said interface.

11. The electromagnetic radiation emitter of claim 7, wherein said stack constitutes an optical microcavity that optically couples with said at least one two-dimensional carbon lattice structure at a resonance wavelength λ, wherein said first transparent layer has a first thickness t1 and a first index of refraction n1 at said resonance wavelength λ, and said second transparent layer has a second thickness t2 and a second index of refraction n2 at said resonance wavelength λ, and four times a product of said first thickness t1 and said first index of refraction is substantially equal to said resonance wavelength λ, and four times a product of said second thickness t2 and said second index of refraction is substantially equal to said resonance wavelength λ.

12. The electromagnetic radiation emitter of claim 7, wherein said at least one two-dimensional carbon lattice structure includes at least one of a graphene layer or a carbon nanotube.

13. An electromagnetic radiation modulator comprising:
a stack, from bottom to top, of a first partial mirror, a first transparent layer, a second transparent layer, and a second partial mirror;
at least one two-dimensional carbon lattice structure embedded in said second transparent layer;
a first contact electrode in contact with one end of said at least one two-dimensional carbon lattice structure and embedded within said second transparent layer;
a second contact electrode in contact with an opposite end of said at least one two-dimensional carbon lattice structure and embedded within said second transparent layer; and
a circuit configured to apply electrical bias to one of said first partial mirror and said second partial mirror relative to said first contact electrode, and to modulate electrical current through said at least one two-dimensional carbon lattice structure, wherein a transmission coefficient of electromagnetic radiation passing through said stack is modulated by electrical current passing through said at least one two-dimensional carbon lattice structure.

14. The electromagnetic radiation modulator of claim 13, wherein said first transparent layer has a first thickness and a first index of refraction at a wavelength of the electromagnetic radiation, and said second transparent layer has a second thickness and a second index of refraction at said wavelength, and a product of said second thickness and said second index of refraction is within 25% of a product of said first thickness and said first index of refraction.

15. The electromagnetic radiation modulator of claim 13, wherein said at least one two-dimensional carbon lattice structure has a bottom surface that is coplanar with an interface between said first transparent layer and said second transparent layer.

16. The electromagnetic radiation modulator of claim 15, wherein each of said first contact electrode and said second contact electrode has a bottommost surface that is coplanar with said interface.

17. The electromagnetic radiation modulator of claim 13, wherein said stack constitutes an optical microcavity that optically couples with said at least one two-dimensional carbon lattice structure at a resonance wavelength λ, wherein said first transparent layer has a first thickness t1 and a first index of refraction n1 at said resonance wavelength λ, and said second transparent layer has a second thickness t2 and a second index of refraction n2 at said resonance wavelength λ, and four times a product of said first thickness t1 and said first index of refraction is substantially equal to said resonance wavelength λ, and four times a product of said second thickness t2 and said second index of refraction is substantially equal to said resonance wavelength λ.

18. The electromagnetic radiation modulator of claim 13, wherein said transmission coefficient is wavelength-dependent, and is at a maximum at said resonance wavelength λ while electrical current does not pass through said at least one two-dimensional carbon lattice structure.

19. The electromagnetic radiation modulator of claim 13, wherein said at least one two-dimensional carbon lattice structure includes at least one of a graphene layer or a carbon nanotube.

20. A method of forming an optoelectronic device comprising:
forming a first transparent layer on a substrate;
placing at least one two-dimensional carbon lattice structure on a top surface of said first transparent layer;
forming a first contact electrode on one end of said at least one two-dimensional carbon lattice structure and a second contact electrode on another end of said at least one two-dimensional carbon lattice structure;
forming a second transparent layer on said at least one two-dimensional carbon lattice structure, said first and second contact electrodes, and said first transparent layer;
forming a first partial mirror on a bottom surface of said first transparent layer and a second partial mirror on a top surface of said second transparent layer; and
forming a circuit that electrically biases said second contact electrode relative to said first contact electrode.

21. The method of claim 20, wherein said circuit is connected across said first contact electrode and said second contact electrode, and is configured to measure electrical current that passes through said at least one two-dimensional carbon lattice structure upon irradiation of said at least one two-dimensional carbon lattice structure with electromagnetic radiation.

22. The method of claim 20, wherein said circuit is connected across said first contact electrode and said second contact electrode, and is configured to switch electrical current that passes through said at least one two-dimensional carbon lattice structure, wherein electromagnetic radiation is emitted from said at least one two-dimensional carbon lattice structure while electrical current passes through said at least one two-dimensional carbon lattice structure.

23. The method of claim 20, wherein said circuit is configured to apply electrical bias to one of said first partial mirror and said second partial mirror relative to said first contact electrode, and to modulate electrical current through said at least one two-dimensional carbon lattice structure, wherein a transmission coefficient of electromagnetic radiation passing through a stack of said first partial mirror, said first transparent layer, said second transparent layer, and said second partial mirror is modulated by electrical current passing through said at least one two-dimensional carbon lattice structure.

24. The method of claim 20, wherein said first transparent layer has a first thickness and a first index of refraction at a wavelength of electromagnetic radiation, and said second transparent layer has a second thickness and a second index of refraction at said wavelength, and a product of said second thickness and said second index of refraction is within 25% of a product of said first thickness and said first index of refraction.

25. The method of claim 20, wherein a stack of said first partial mirror, said first transparent layer, said second transparent layer, and said second partial mirror constitutes an optical microcavity that couples electromagnetic radiation at a resonance wavelength $\lambda$ with said at least one two-dimensional carbon lattice structure, wherein said first transparent layer has a first thickness t1 and a first index of refraction n1 at said resonance wavelength $\lambda$, and said second transparent layer has a second thickness t2 and a second index of refraction n2 at said resonance wavelength $\lambda$, and four times a product of said first thickness t1 and said first index of refraction is substantially equal to said resonance wavelength $\lambda$, and four times a product of said second thickness t2 and said second index of refraction is substantially equal to said resonance wavelength $\lambda$.

\* \* \* \* \*